(12) United States Patent
Takeno

(10) Patent No.: US 7,033,962 B2
(45) Date of Patent: Apr. 25, 2006

(54) METHODS FOR MANUFACTURING SILICON WAFER AND SILICONE EPITAXIAL WAFER, AND SILICON EPITAXIAL WAFER

(75) Inventor: Hiroshi Takeno, Annaka (JP)

(73) Assignee: Shin-Etsu Handotai Co., Ltd., (JP)

( * ) Notice: Subject to any disclaimer, the term of this patent is extended or adjusted under 35 U.S.C. 154(b) by 58 days.

(21) Appl. No.: 10/482,843

(22) PCT Filed: May 30, 2002

(86) PCT No.: PCT/JP02/05000

§ 371 (c)(1),
(2), (4) Date: Jan. 6, 2004

(87) PCT Pub. No.: WO03/009365

PCT Pub. Date: Jan. 30, 2003

(65) Prior Publication Data

US 2004/0171234 A1    Sep. 2, 2004

(30) Foreign Application Priority Data

Jul. 10, 2001 (JP) ............................. 2001-209160
Sep. 27, 2001 (JP) ............................. 2001-296743
Sep. 27, 2001 (JP) ............................. 2001-296744
Sep. 27, 2001 (JP) ............................. 2001-296745

(51) Int. Cl.
*H01L 21/26* (2006.01)

(52) U.S. Cl. .................................................. 438/799

(58) Field of Classification Search ................ 438/795, 438/799; 250/492.1, 492.2
See application file for complete search history.

(56) References Cited

U.S. PATENT DOCUMENTS

| 4,437,922 A | 3/1984 | Bischoff et al. |
| 6,200,872 B1 | 3/2001 | Yamada |

FOREIGN PATENT DOCUMENTS

| EA | 0090320 A1 | 10/1983 |
| JP | 58-21829 A1 | 2/1983 |

(Continued)

OTHER PUBLICATIONS

Masanori Akatsuka et al.; Effect of Oxide Precipitate Size on Slip Generation in Large Diameter Epitaxial Wafers;Japanese Journal of Applied Physics; vol. 37 (1998) pp. 4663-4666.

*Primary Examiner*—Scott Geyer
(74) *Attorney, Agent, or Firm*—Rader, Fishman & Grauer PLLC

(57) ABSTRACT

There is provided a method for manufacturing a silicon wafer or a silicon epitaxial wafer capable of imparting an excellent IG capability thereto in a stable manner by simultaneously realizing higher density of oxide precipitates and larger sizes thereof at a stage prior to a device fabrication process. The present invention is a method for manufacturing a silicon wafer wherein the silicon wafer is subjected to heat treatment to impart a gettering capability thereto comprising at least the following three steps of: a temperature raising step A for generating oxygen precipitation nuclei; a temperature raising step B for growing the oxygen precipitation nuclei; and a constant temperature keeping step C for growing the oxygen precipitation nuclei into oxide precipitates of larger sizes.

9 Claims, 14 Drawing Sheets

FOREIGN PATENT DOCUMENTS

| | | | |
|---|---|---|---|
| JP | 58-87833 A1 | 5/1983 |
| JP | 58-171826 A1 | 10/1983 |
| JP | 03-185831 A1 | 8/1991 |
| JP | 04-276628 A1 | 10/1992 |
| JP | 05-308076 A1 | 11/1993 |
| JP | 08-45946 A1 | 2/1996 |
| JP | 08-97220 A1 | 4/1996 |
| JP | 11-168106 A1 | 6/1999 |
| JP | 11-297704 A1 | 10/1999 |
| JP | 2001-151597 A1 | 6/2001 |

US 7,033,962 B2

METHODS FOR MANUFACTURING SILICON WAFER AND SILICONE EPITAXIAL WAFER, AND SILICON EPITAXIAL WAFER

TECHNICAL FIELD

The present invention relates to methods for manufacturing a silicon wafer and a silicon epitaxial wafer capable of obtaining the silicon wafer and the silicon epitaxial wafer having a defect-free layer (a DZ layer or an epitaxial layer) in the vicinity of a surface thereof and oxide precipitates high in gettering capability in the bulk thereof through heat treatment with extreme efficiency and simplicity, and a silicon epitaxial wafer.

BACKGROUND ART

Most of silicon wafers used widely as substrates of semiconductor devices are manufactured from a silicon single crystal grown-in a Czochralski (CZ) method. The silicon single crystal grown-in the CZ method contains interstitial oxygen as impurities at concentration of about $10^{18}$ atoms/cm$^3$. The interstitial oxygen turns into a supersatulated state in a thermal history from solidification of a melt till cooling down thereof to room temperature during a crystal growth step (hereinafter which may be referred to as a crystal thermal history) or in a heat treatment step of a fabrication process of semiconductor devices to then precipitate, precipitates of silicon oxides (hereinafter may be referred to as oxide precipitates or simply precipitates) being generated.

The oxide precipitates work effectively as sites capturing heavy metal impurities contaminated in a device fabrication process. This is called internal gettering (hereinafter may be referred to as IG or simply gettering) and improves device characteristics and a yield. For this reason, an IG capability is valued highly as one of properties of a silicon wafer.

The process of oxygen precipitation includes formation of precipitation nuclei and their growth. Usually formation of nuclei progresses during a crystal thermal history, and then the nuclei grow greatly in heat treatment of the following device fabrication process and others, the grown nuclei being detected as oxide precipitates. For this reason, the precipitation nuclei generated during the crystal thermal history are referred to as grown-in precipitation nuclei. As a matter of course, oxygen precipitation nuclei may be generated in subsequent heat treatment.

A usual as-grown wafer (a wafer subjected to no heat treatment except for general oxygen donor anihilation heat treatment) has no IG capability because oxygen precipitation nuclei existing at a stage prior to a device fabrication process are extremely small. However, after the as-grown wafer has been subjected to the device fabrication process, the nuclei grow to large oxide precipitates and then the wafer has an IG capability.

Since density of oxygen precipitation nuclei generated during a crystal thermal history depends on the length of the thermal history, there arises a problem that the density is largely fluctuated according to crystal pulling conditions such as a pulling rate or a position in the direction of a crystal growth axis. For example, in a process producing one crystal, a portion grown-in a latter half thereof has lower density of oxygen precipitation nuclei because of a shorter thermal history. This causes a fluctuation in density of oxygen precipitation nuclei to be generated during a device fabrication process, resulting in a fluctuation in an IG capability.

On the other hand, when oxide precipitates exist in a device fabrication region in the vicinity of a wafer surface, degradation of the device characteristics occurs. For this reason, in order to prevent progress in oxygen precipitation by Out-diffusing oxygen in the vicinity of the wafer surface, the wafer may be heat-treated at 1100° C. or higher for several hours. In this case, most of grown-in precipitation nuclei are annihilated and thereby, oxide precipitates are not generated in the following device fabrication process.

Therefore, in order to regenerate oxygen precipitation nuclei, the wafer is subjected to heat treatment at about 650° C. for a long time on the order of 3 hrs to 30 hrs. Further, in order to grow the regenerated oxygen precipitation nuclei into large oxide precipitates having an IG capability, the wafer may be additionally subjected to heat treatment at about 1000° C. There is generally called DZ-IG treatment a combination of the three types of heat treatment, that is, the heat treatment out-diffusing oxygen residing in the vicinity of the wafer surface, the heat treatment generating oxygen precipitation nuclei in the interior of the wafer, and the heat treatment growing the oxygen precipitation nuclei.

With the DZ-IG treatment, an ideal structure is formed in which there are no oxide precipitates in the vicinity of a wafer surface to be a device fabrication region, while there are generated oxide precipitates having an IG capability in the interior thereof (hereinafter the structure may be referred to as a DZ-IG structure). However, this treatment is long in the total process for heat treatment, resulting in poor efficiency.

Also, a general CZ wafer contains void-like defects generated by aggregation of atomic vacancies in addition to grown-in precipitation nuclei. When the void defect is exposed on a surface of a mirror-polished wafer, they are observed as surface pits called COP (crystal originated particle). When the COPs and voids are present in the device fabrication region, degradation of the device characteristics occurs too. For this reason, in order to eliminate the COPs and voids in the vicinity of the wafer surface, the wafer may be subjected to high-temperature heat treatment at a temperature of the order of 1200° C. or higher in hydrogen or argon atmosphere.

However, in this case, a problem arises that thermal stress causes slip generation. In order to suppress slip generation, a temperature of heat treatment is desirably lower, while at lower heat treatment temperatures, the COPs and voids are harder to be eliminated.

Further, in this case as well, an IG capability is preferably to be imparted. Then, as a method in which annihilation of the COPs and voids in the vicinity of a wafer surface and generation of oxide precipitates in the interior of the wafer are simultaneously realized, there has been known a method in which nitrogen is added during crystal growth. In a wafer added with nitrogen, smaller voids are easily annihilated by high-temperature heat treatment, while larger grown-in precipitation nuclei grow without annihilation even in high-temperature treatment into oxide precipitates, thereby an IG capability being imparted.

However, even when a wafer added with nitrogen is used, there is no change in that it is necessarily subjected to high-temperature heat treatment at about 1200° C. As the wafer diameter becomes larger, the slip more easily generates; therefore especially in a 300 mm wafer that is the mainstream hereafter, there becomes a great problem need of high-temperature heat treatment at about 1200° C. or higher.

Further, since the area where void defects are annihilated is in a very thin surface layer of the order of several μm from the surface, the void defects may degrade device characteristics in a device using a surface layer deeper than the very thin surface layer as a device fabrication region.

In order to bring a device fabrication region in the vicinity of a wafer surface into a defect-free state, there may be used an epitaxial wafer (hereinafter may be referred to as an epi wafer) that is manufactured by depositing silicon single crystal on a silicon wafer as an epitaxial growth substrate by means of vapor phase growth. In this epi wafer, it is also important to impart an IG capability to the substrate.

However, since a usual epitaxial step (hereinafter may be referred to as an epi step) is operated at a high-temperature of about 1100° C. or higher, most oxygen precipitation nuclei (grown-in precipitation nuclei) in the substrate generated in a crystal thermal history are annihilated and thereby no oxide precipitates are generated in the subsequent device fabrication process. Accordingly, in an epi wafer, there arises a problem that an IG capability deteriorates.

As a solution of this problem, there has been known a method in which by performing heat treatment at about 800° C. prior to an epi step, grown-in precipitation nuclei generated in a crystal thermal history are grown to sizes not to be annihilated even in a high-temperature epi step. In this method, when a heat treatment temperature prior to epi growth is 800° C., grown-in precipitation nuclei with sizes equal to or larger than a critical size (the minimum size of a precipitation nucleus that can stably grow at the temperature) at 800° C. grow and survive during an epi step, and the survived nuclei further grow into oxide precipitates in heat treatment such as a device fabrication process after the epi step.

In general, density of small grown-in precipitation nuclei is higher, while density of large grown-in precipitation nuclei is lower. Furthermore, the lower the heat treatment temperature is, the smaller the critical size becomes. Therefore, in order to generate grown-in precipitation nuclei at higher density for imparting a more excellent IG capability, it is desirable to lower the heat treatment temperature prior to the epi step. However, if the heat treatment temperature is lowered, a growth rate of precipitation nuclei is slowed, so a long time of heat treatment is required for growing the precipitation nuclei to sizes not to be annihilated even in an epi step, which is not preferable because of reduction in productivity.

Furthermore, if there exist oxide precipitates having sizes not to be annihilated even in an epi step, in a recent device fabrication process having a lower temperature and a shorter time, no further growth of the oxide precipitates can be expected in heat treatment of the device fabrication process. In order to exert a gettering capability in such a recent device fabrication process, it is necessary to generate oxide precipitates with sizes having a gettering capability at high density prior to the device fabrication process.

As described above, in the recent device fabrication process, a trend of a lower temperature and a shorter time in a device fabrication process has progressed in company with the use of a larger-size wafer therein; for example, a series of steps in the device fabrication process are all performed at a temperature of 1000° C. or lower, and RTP (rapid thermal processing) requiring only a heat treatment time of the order of some tens of seconds has frequently been employed. In such a device fabrication process, the total heat treatment is no more than equal to heat treatment at 1000° C. for about 2 hrs so that growth of oxide precipitates as in a conventional process cannot be expected during the device fabrication process.

DISCLOSURE OF THE INVENTION

The present invention has been made in light of the following prior art problems: that in general silicon wafers a difference in a crystal thermal history creates fluctuations in density of oxygen precipitation nuclei to thereby cause fluctuations in an IG capability in a device fabrication process; that in general DZ-IG treatment for bringing the vicinity of a surface of a wafer into a defect-free state and generating oxide precipitates having an IG capability in the interior thereof, a heat treatment process for the purpose requires a long time and is not efficient; and that in order to annihilate COPs and voids in the vicinity of the wafer surface and furthermore to impart an IG capability, high-temperature heat treatment at about 1200° C. or higher is required, so that metal contamination and slip easily occur, the depth of the area where voids are annihilated being shallow.

Furthermore, the present invention has been made in light of the following prior art problems: that in general epitaxial wafers and wafers subjected to high-temperature heat treatment at 1000° C. or higher, oxygen precipitation nuclei are annihilated in an epi step or a high-temperature heat treatment process so that oxide precipitates are not generated in a device fabrication process, thereby an IG capability being degraded; that in a process where low-temperature heat treatment is applied prior to an epi step or a high-temperature heat treatment process in order to impart an IG capability, for imparting a more excellent IG capability a heat treatment time becomes longer with a resulting poor efficiency; and moreover, that if there exist oxide precipitates of sizes not to be annihilated even in an epi step or high-temperature heat treatment, in the recent device fabrication process having a lower temperature and a shorter time, no further growth of the oxide precipitates cannot be expected in heat treatment during the device fabrication process.

It is a first object of the present invention to provide a method for manufacturing a silicon wafer or a silicon epitaxial wafer capable of imparting an excellent IG capability thereto in a stable manner by simultaneously realizing higher density of oxide precipitates and larger sizes thereof at a stage prior to a device fabrication process.

It is a second object of the present invention to provide a method for manufacturing a silicon wafer capable of efficiently forming a DZ-IG structure by simultaneously realizing growth of grown-in precipitation nuclei existing in an interior of a wafer into oxide precipitates each of a size equal to or larger than one having a gettering capability, and annihilation of grown-in precipitation nuclei in the vicinity of the wafer surface by simple heat treatment, and of efficiently forming an extremely high quality DZ-IG structure by more perfectly annihilating oxide precipitates in the formed DZ layer.

It is a third object of the present invention to provide a method for manufacturing a silicon epitaxial wafer capable of efficiently growing grown-in precipitation nuclei generated in a crystal thermal history in a short time with annihilation thereof being suppressed to the lowest level possible, imparting an excellent IG capability thereto even in a device fabrication process having a lower temperature and a shorter time, and efficiently manufacturing an epitaxial wafer exerting an enough gettering capability even in the recent device fabrication process having a lower temperature and a shorter time; and to provide a silicon epitaxial wafer.

In order to solve the above problems, a first aspect of a method for manufacturing a silicon wafer of the present invention wherein the silicon wafer is subjected to heat treatment to impart an excellent IG capability thereto in a stable manner, comprises at least the following three steps of: a temperature raising step A for generating oxygen precipitation nuclei; a temperature raising step B for growing the oxygen precipitation nuclei; and a constant temperature keeping step C for growing the oxygen precipitation nuclei into oxide precipitates of larger sizes. The temperature raising step A, the temperature raising step B and the constant temperature keeping step C are preferably performed continuously in the order of the above steps.

In the first aspect of the method for manufacturing a silicon wafer of the present invention, the temperature raising step A is a step for raising the temperature from $T_1°$ C. to $T_2°$ C. at a rate of an $R_1°$ C./min, wherein it is preferable that the $T_1°$ C. is about 650° C. or lower, the $T_2°$ C. is about 700° C. or higher and the $R_1°$ C./min is about 1.5° C./min or less.

The lower the $T_1°$ C., the higher the density of precipitates, but a process time required for generating the precipitates becomes longer, so the $T_1°$ C. is preferably 500° C. or higher. However, when the $T_1°$ C. is higher than 650° C., there are instances where density of precipitates cannot be obtained sufficiently. Similarly, when the $T_2°$ C. is lower than 700° C., there are also instances where density of precipitates cannot be obtained sufficiently, so the $T_2°$ C. is preferably 700° C. or higher. The upper limit of the $T_2°$ C. is $T_3°$ C. in light of a heat treatment process. From the viewpoints of higher density of precipitates and a shorter process time, the $T_2°$ C. is preferably 750° C. or higher and 850° C. or lower.

Furthermore, the lower the rate of the $R_1°$ C./min, the higher the density of precipitates; in order to obtain sufficient density of precipitates, the $R_1°$ C./min is preferably 1.5° C./min or less. But at an excessively low rate thereof, a required process time for generating precipitates becomes longer; the $R_1°$ C./min is preferably 0.5° C./min or more.

By the temperature raising step A, oxygen precipitation nuclei can be generated at high density. Accordingly, oxygen precipitation nuclei can be generated at high density even in an epi wafer containing almost no oxygen precipitation nuclei and a silicon wafer subjected to heat treatment in advance at about 1000° C. or higher. Even in a wafer in which oxygen precipitation nuclei are not sufficiently generated during a crystal thermal history, oxygen precipitation nuclei of high density can be generated. Therefore, it is possible to increase density of oxide precipitates to be generated in subsequent steps.

Furthermore, if there is a desire for changing the density of oxide precipitates to a level of contamination in a device fabrication process, the density can be easily changed, for example, by setting the $T_2°$ C. to about 750° C. and an $R_1°$ C./min to about 1° C./min, and changing the $T_1°$ C. It is needless to say that the higher the density of oxide precipitates, the higher the IG capability, but when making the density higher, a longer process time is required. Accordingly, it is an important effect to enable the density to be easily changed in order to efficiently achieve necessary density.

The temperature raising step B is a step for raising the temperature from $T_2°$ C. to $T_3°$ C. at a rate of an $R_2°$ C./min, wherein it is preferable that the $T_2°$ C. is about 700° C. or higher, the $T_3°$ C. is about 1000° C. or higher and the $R_2°$ C./min is equal to the $R_1°$ C./min or more and about 7° C./min or less. In the temperature raising step, oxygen precipitation nuclei generated in the temperature raising step A can be efficiently grown.

At the $T_3°$ C. of 1000° C. or higher, precipitates can be grown to sufficiently large sizes. The higher the $T_3°$ C., the larger the precipitates, but in order to prevent generation of slip and metal contamination, the $T_3°$ C. is preferably 1230° C. or lower, more preferably 1150° C. or lower, further preferably 1100° C. or lower.

While it is preferable that the $R_2°$ C./min is sufficiently low, an excessive low rate thereof leads to a longer process time. Therefore, the $R_2°$ C./min is desirably the $R_1°$ C./min or more and about 7° C./min or less. At the $R_2°$ C./min of about 7° C./min or less, oxygen precipitation nuclei generated in the previous step can be efficiently grown such that almost all oxygen precipitation nuclei are not annihilated. Moreover, in order to increase the density of precipitates, the $R_2°$ C./min is preferably equal to the $R_1°$ C./min or more and 5° C./min or less.

The higher the temperature is, the faster the growth rate of precipitates becomes, so that by setting the $R_2°$ C./min to a higher rate equal to or higher than the $R_1°$ C./min, it is possible to grow the precipitates in a shorter time.

The constant temperature keeping step C is a step for keeping the wafer at the $T_3°$ C. for t time, wherein it is preferable that the $T_3°$ C. is about 1000° C. or higher and the t time is about 1 hr or longer. In the constant temperature keeping step C, minute oxide precipitates grown-in the temperature raising step B can be further grown into large oxide precipitates having an IG capability. Therefore, an excellent IG capability can be exerted even in a device fabrication process having a lower temperature and a shorter time where growth of oxide precipitates could not be expected. Note that the longer the t time is, the larger the size of the precipitate becomes, but a process time becomes longer, resulting in lower productivity; therefore, the t time is preferably 4 hrs or shorter.

Here, as for a size of an oxide precipitate having an IG capability, there is used as a guideline the size of the oxide precipitate detectable experimentally (about 30 nm to 40 nm in diameter). Generally, even the oxide precipitate of the size non-detectable experimentally is considered as having an IG capability, so it is possible to infer that the oxide precipitate of the size detectable experimentally has a sufficient IG capability.

Further, by changing the keeping temperature $T_3°$ C. and the keeping time, t time, it is possible to easily change the size of the oxide precipitate. It is considered that the larger the size of the oxide precipitate is, the higher the IG capability becomes; a process time lengthens. Accordingly, in order to efficiently achieve the necessary size of the oxide precipitate, the effect that the size is easily changeable is also important.

While a wafer can be unloaded from a heat treatment furnace in intervals between the temperature raising step A and the temperature raising step B, and between the temperature raising step B and the constant temperature keeping step C, a total process time can be shortened by performing the above three steps continuously.

After the constant temperature keeping step C, irrespective of a temperature in the heat treatment furnace when the wafer is unloaded therefrom and a temperature lowering rate down to the temperature, the temperatures are desirably determined such that no slip is generated owing to thermal stress. For example, after the temperature in the heat treatment furnace is lowered from the $T_3°$ C. to 800° C. at 2° C./min, the wafer can be unloaded from the heat treatment furnace.

In order to sufficiently achieve the effect of the first aspect of the method for manufacturing a silicon wafer of the present invention, oxygen concentration of the silicon wafer is desirably about 17 ppma or higher. At higher oxygen concentration, a nucleus generating rate and a nucleus growth rate become faster, which shortens a total process time. Even at lower oxygen concentration, for example, by adopting a lower temperature of the $T_1°$ C., or lower rates of the $R_1°$ C./min and $R_2°$ C./min, the effect of the first aspect of the method for manufacturing a silicon wafer of the present invention can be achieved.

The first aspect of the method for manufacturing a silicon wafer of the present invention can also be effectively applied to an epitaxial wafer and a silicon wafer subjected to heat treatment at 1000° C. or higher (especially 1100° C. or higher) in advance.

As described above, according to the first aspect of the method for manufacturing a silicon wafer of the present invention, higher density of oxide precipitates and larger sizes thereof can be simultaneously realized at a stage prior to a device fabrication process. Accordingly, in a wafer containing almost no oxygen precipitation nuclei, large oxide precipitate s. can be generated at high density and an excellent IG capability can be exerted in a device fabrication process having a lower temperature and a shorter time where growth of oxide precipitates could not be expected.

As an additional effect of the first aspect of the method for manufacturing a silicon wafer of the present invention, there can be given an effect to suppress generation of slip dislocations due to thermal stress. It has been known that dislocations constituting slip can be pinned by oxide precipitates. Therefore, by generating large oxide precipitates at higher density according to the first aspect of the method for manufacturing a silicon wafer of the present invention, a probability that the dislocations are pinned becomes higher, thereby generation of slip dislocations being suppressed.

A second aspect of the method for manufacturing a silicon wafer of the present invention comprises the steps of: keeping the silicon wafer having grown-in precipitation nuclei generated in a growth step of a silicon single crystal at a temperature $T_4°$ C. in the range of from 500° C. to 700° C. for a prescribed time $t_1$; then raising the temperature of the silicon wafer to a temperature $T_5°$ C. in the range of from 1000° C. to 1230° C. at a temperature raising rate $R°$ C./min of 5° C./min or less; and keeping the wafer at the temperature $T_5°$ C. for a prescribed time $t_2$, thereby the grown-in precipitation nuclei being grown into oxide precipitates each of a size equal to or larger than one having a gettering capability, and oxygen in the vicinity of a surface of the silicon wafer being out-diffused.

Thus, by raising a temperature of a silicon wafer from a low temperature ($T_4°$ C.) to a high temperature ($T_5°$ C.) at a slow temperature raising rate of 5° C./min or less and keeping it at the high temperature for a prescribed time, grown-in precipitation nuclei in the bulk of the silicon wafer can be effectively grown into their sizes each equal to or larger than one having a gettering capability without the grown-in precipitation nuclei being annihilated. Furthermore, simultaneously along with the growth, by out-diffusing oxygen in the vicinity of a surface of the silicon wafer, oxygen precipitation nuclei can be annihilated, so that a DZ layer free of oxide precipitates is formed in the vicinity of the surface thereof. That is, according to the second aspect of the method for manufacturing a silicon wafer of the present invention, a DZ-IG structure can be formed by simple one step heat treatment alone.

Here, as for a size of an oxide precipitate having an IG capability, there is used as a guideline the size of the oxide precipitate detectable experimentally (about 30 nm to 40 nm in diameter). Generally, even the oxide precipitate of the size non-detectable experimentally is considered as having an IG capability, so it is possible to infer that the oxide precipitate of the size detectable experimentally has a sufficient IG capability. Accordingly, the size having a gettering capability is preferably about 40 nm or larger in diameter. While no specific limitation is put on the upper limit of a size of an oxide precipitate, since a heat treatment time becomes longer in order to grow it to a larger size, it is preferably 100 nm or less in diameter.

When the temperature of the $T_5°$ C. is lower than about 1000° C., a time required for growing larger oxide precipitates becomes longer, resulting in a longer total process time. The higher the $T_5°$ C. is, the shorter the time for growing larger oxide precipitates becomes; therefore it is possible to shorten a total process time, but the $T_5°$ C. is preferably 1230° C. or lower since metal contamination from a heat treatment furnace is noticeable at a high temperature in excess of about 1230° C.

The lower the temperature $T_4°$ C. is, the higher the density of oxide precipitates becomes, but a process time lengthens, so the $T_4°$ C. is preferably about 500° C. or higher. At a temperature in excess of about 700° C. of the $T_4°$ C., there are occasions where the density of the precipitates is insufficiently achieved. Similarly, the lower the temperature raising rate of $R°$ C./min is, the higher the density of precipitates becomes, but at an excessively low rate thereof, a process time is longer; therefore, the $R°$ C./min is preferably about 1° C./min or more. If the temperature raising rate of $R°$ C./min is a high rate in excess of about 5° C./min, the proportion of grown-in precipitation nuclei that are annihilated without growth becomes higher, so that there are occasions where the density of precipitates cannot be sufficiently achieved.

By setting the temperature raising rate of the $R°$ C./min from the $T_4°$ C. to the $T_5°$ C. to 5° C./min or less, grown-in precipitation nuclei can be efficiently grown, annihilation thereof being suppressed to the lowest level possible. That is, since existing grown-in precipitation nuclei generated in a crystal growth step are grown, density of precipitates can be sufficiently enhanced even without a heat treatment step for newly generating oxygen recipitation nuclei, which enables a total process time to be short.

In the second aspect of the method for manufacturing a silicon wafer of the present invention, prior to temperature raising from the $T_4°$ C. to the $T_5°$ C., the keeping time $t_1$ at the $T_4°$ C. may be 0 min without hindrance, but more preferably 15 min or longer. Thereby, the grown-in precipitation nuclei are harder to be annihilated, and furthermore, new oxygen precipitation nuclei can be generated in addition to the existing grown-in precipitation nuclei; higher density of oxygen precipitation nuclei may be generated. Further, since a process time becomes longer when the keeping time is long, the keeping time ti is preferably about 60 min or shorter.

Note that the lower the $T_4°$ C. is or the longer the keeping time $t_1$ at the $T_4°$ C. is or the slower the temperature raising rate is, the more the new precipitation nuclei are generated during the temperature raising step, and the higher the density of precipitates becomes.

The keeping time $t_2$ at a temperature of the $T_5°$ C. is preferably about 30 min or longer in order to certainly grow the grown-in precipitation nuclei to sizes each having a gettering capability or in order to form a DZ layer with a sufficient width. The longer the keeping time $t_2$ is, the larger the sizes of oxide precipitates in the bulk of a silicon wafer becomes; a DZ width in the vicinity of a surface of the silicon wafer can be increased, but the process time becomes longer so that the keeping time $t_2$ is preferably about 4 hrs or shorter and more preferably about 2 hrs or shorter. On the other hand, when the keeping time $t_2$ is shorter than about 30 min, due to slight fluctuations in time, chances are that neither oxide precipitates having desired sizes nor a desired DZ width can be achieved.

In order to sufficiently achieve the effect of the second aspect of the method for manufacturing a silicon wafer of the present invention, oxygen concentration of a silicon wafer to be heat-treated is desirably about 16 ppma or higher. The higher the oxygen concentration is, the higher the density of precipitates becomes; a more excellent IG capability can be imparted to the silicon wafer. Further, the higher the oxygen concentration is, the faster the growth rate of the precipitates becomes; a total process time becomes shorter. However, even when the oxygen concentration is low, for example, by lowering the temperature raising initiation temperature of the $T_4°$ C. in the temperature raising step, or lengthening the keeping time at the $T_5°$ C., there can be achieved the effect of the second aspect of the method for manufacturing a silicon wafer of the present invention. Accordingly, no specific limitation is put on the upper limit of the oxygen concentration in the second aspect of the method for manufacturing a silicon wafer of the present invention, but it is preferably about 23 ppma or less in consideration for the ease in production of silicon single crystals.

Also, according to the second aspect of the method for manufacturing a silicon wafer of the present invention, an effect can be achieved that suppresses generation of slip dislocations due to the thermal stress during the device fabrication process. It has been known that the dislocation constituting slip is pinned by an oxide precipitate. Therefore, by generating oxide precipitates each having a certain large size at high density according to the second aspect of the method for manufacturing a silicon wafer of the present invention, a probability is enhanced that dislocations are pinned, thus generation of slip dislocations being suppressed. That is, the second aspect of the method for manufacturing a silicon wafer of the present invention can be especially preferably applied to a large diameter wafer of 300 mm or larger in diameter, which would be subject to generation of slip dislocations by heat treatment. In order to suppress generation of slip dislocations, the $T_5°$ C. is preferably 1200° C. or lower, more preferably about 1150° C. or lower.

Further, by applying the second aspect of the method for manufacturing a silicon wafer of the present invention to a wafer having a few defects with few COPs and voids which is manufactured from a silicon single crystal pulled in a condition that suppresses generation of void defects in growth thereof, an extremely high quality DZ-IG structure having hardly not only oxide precipitates but also COPs and voids can be formed without applying high-temperature treatment at a high temperature of about 1200° C. This is especially effective for a 300 mm diameter wafer that is a future main stream from the viewpoint of suppression of generation of slip.

The above described wafer having a few defects can be manufactured by using a known technique that a single crystal is pulled while controlling a ratio V/G between a crystal pulling rate V and a temperature gradient G in the vicinity of a solid liquid interface in a growing crystal as is described in, for example, JP A 99-147786 and JP A 99-157996.

A third aspect of a method for manufacturing a silicon wafer of the present invention wherein the silicon wafer having grown-in precipitation nuclei generated in a growth step of a silicon single crystal is subjected to heat treatment to make a surface layer thereof defect-free and impart a gettering capability to an interior thereof, comprises at least the following three steps of: a temperature raising step $A_1$ for growing the grown-in precipitation nuclei; a temperature raising step $B_1$ for further raising a temperature of the silicon wafer to a keeping temperature higher than that in the temperature raising step Al; and a constant temperature keeping step $C_1$ for growing the grown-in precipitation nuclei into oxide precipitates each of a size equal to or larger than one having a gettering capability and for out-diffusing oxygen in the vicinity of a surface of the silicon wafer. It is desirable that the temperature raising step $A_1$, the temperature raising step $B_1$ and the constant temperature keeping step $C_1$ are performed continuously in this order.

In the third aspect of a method for manufacturing a silicon wafer of the present invention, the temperature raising step $A_1$ is a step of raising a temperature of the silicon wafer from $T_6°$ C. to $T_7°$ C. at a rate of $R_3°$ C./min, wherein it is preferable that the $T_6°$ C. is 700° C. or lower, the $T_7°$ C. is 800° C. to 1000° C. and the $R_3°$ C./min is 3° C./min or less.

The lower the $T_6°$ C. is, the higher the density of grown-in precipitation nuclei becomes and then the higher the density of precipitates becomes, but a process time required for growing the grown-in precipitation nuclei lengthens; the $T_6°$ C. is preferably 500° C. or higher. When the $T_6°$ C. is higher than 700° C., there are occasions where the density of precipitates cannot be sufficiently achieved.

When the $T_7°$ C. is lower than 800° C., the grown-in precipitation nuclei cannot be sufficiently grown-in the temperature raising step $A_1$ and the proportion of grown-in precipitation nuclei to be annihilated in the following temperature raising step $B_1$ becomes higher; there are occasions where the density of precipitates cannot be sufficiently achieved. When the $T_7°$ C. is higher than 1000° C., grown-in precipitation nuclei in the vicinity of a surface of the silicon wafer grow larger and survive in the vicinity of the surface of the silicon wafer even after being subjected to the subsequent temperature raising step $B_1$ and the constant temperature keeping step $C_1$; there are occasions where the density of precipitates in a DZ layer increases.

Moreover, as the rate of the $R_3°$ C./min is lower, there becomes higher the proportion that the grown-in precipitation nuclei grow without annihilation and then the density of precipitates is raised, so that the $R_3°$ C./min is preferably 3° C./min or less in order to achieve sufficient density of precipitates, but at a excessively low rate a process time becomes longer with resulting poor efficiency; the $R_3°$ C./min is preferably 0.5° C./min or more.

By the temperature raising step $A_1$, grown-in precipitation nuclei can be efficiently grown, annihilation thereof being suppressed to the lowest level possible. That is, since existing grown-in precipitation nuclei generated in the crystal growth step are grown, the density of precipitates can be sufficiently enhanced even without a heat treatment step for generating new oxygen precipitation nuclei, yet a total process time can be shortened.

Further, prior to raising temperature from the $T_6°$ C. to the $T_7°$ C. in the temperature raising step $A_1$, the keeping time $t_3$ at the $T_6°$ C. may be 0 min without hindrance, but more preferably 30 min or longer. Thereby, the grown-in precipitation nuclei are harder to be annihilated, and furthermore, new oxygen precipitation nuclei can be generated in addition to the existing grown-in precipitation nuclei; higher density of oxygen precipitation nuclei may be generated. Since a process time becomes longer when the keeping time $t_3$ is long, the keeping time $t_3$ is preferably about 4 hrs or shorter.

The temperature raising step $B_1$ is a step for raising a temperature of the silicon wafer from the $T_7°$ C. to the $T_8°$ C. at a rate of $R_4°$ C./min, wherein it is preferable that the $T_7°$ C. is 800° C. to 1000° C., the $T_8°$ C. is 1050° C. to 1230° C. and the $R_4°$ C./min is 5° C./min or more. In the temperature raising step $B_1$, by raising a temperature of the silicon wafer up to a high temperature in a short time, growth of oxide precipitates in the vicinity of a surface of the silicon wafer can be suppressed; the oxide precipitates in the vicinity of the surface thereof can be easily annihilated in the subsequent constant temperature keeping step $C_1$.

When the $T_8°$ C. is 1050° C. or higher, by growing efficiently oxide precipitates in the bulk of the silicon wafer to sufficiently large sizes and out-diffusing oxygen in the vicinity of a surface of the wafer, oxide precipitates in the vicinity of the surface of the silicon wafer can be annihilated. Furthermore, the higher the $T_8°$ C. is, the larger the precipitates in the bulk of the silicon wafer becomes and the wider the DZ width becomes, but at a temperature in excess of about 1230° C. of the $T_8°$ C., metal contamination from a heat treatment furnace becomes remarkable; the $T_8°$ C. is preferably 1230° C. or lower.

When the $R_4°$ C./min is less than 5° C./min, oxide precipitates in the vicinity of the surface of the silicon wafer grow large; they are hard to be annihilated in the subsequent constant temperature keeping step $C_1$. However, if the $R_4°$ C./min is excessively high, the proportion of oxide precipitates in the bulk of the silicon wafer that are annihilated becomes higher, so that the density of precipitates is lowered; the $R_4°$ C./min is desirably 10° C./min or less.

The constant temperature keeping step $C_1$ is a step for keeping the wafer at a temperature $T_8°$ C. for $t_4$ time, wherein it is preferable that the $T_8°$ C. is 1050° C. to 1230° C. and the $t_4$ time is 30 min or longer. By the constant temperature keeping step $C_1$, minute oxide precipitates grown-in the previous temperature raising steps $A_1$ and $B_1$ can be grown into large oxide precipitates each having an IG capability in the bulk of the silicon wafer and can be annihilated in the vicinity of a surface thereof. Accordingly, there can be formed a high quality DZ-IG structure combining a defect-free DZ layer and an IG layer having an excellent IG capability.

Here, as for a size of an oxide precipitate having an IG capability, there is used as a guideline the size of the oxide precipitate detectable experimentally (about 30 nm to 40 nm in diameter). Generally, even the oxide precipitate of the size non-detectable experimentally is considered as having an IG capability, so it is possible to infer that the oxide precipitate of the size detectable experimentally has a sufficient IG capability. Accordingly, the size having a gettering capability is preferably about 40 nm or larger in diameter. While no specific limitation is put on the upper limit of a size of an oxide precipitate, since a heat treatment time becomes longer in order to grow it to a larger size, it is preferably 100 nm or less in diameter.

As the keeping time $t_4$ at the $T_8°$ C. is longer, there becomes larger the sizes of oxide precipitates in the bulk of the silicon wafer and the DZ width becomes wider, but a process time lengthens; the keeping time $t_4$ is preferably about 4 hrs or shorter. On the other hand, when the keeping time $t_4$ is shorter than about 30 min, due to slight fluctuations in time, chances are that neither oxide precipitates having desired sizes nor a desired DZ width can be achieved.

Moreover, by changing the keeping temperature $T_8°$ C. and the keeping time $t_4$, the size of the oxide precipitate and the DZ width can be easily changed. It is considered that the larger the size of the oxide precipitate is, the higher the IG capability becomes, but a process time lengthens. Accordingly, in order to efficiently achieve the necessary size of the oxide precipitate and the DZ width, the effect that the size and the DZ width are easily changeable is also important.

While a wafer can be unloaded from a heat treatment furnace in intervals between the temperature raising step $A_1$ and the temperature raising step $B_1$, and between the temperature raising step $B_1$ and the constant temperature keeping step $C_1$, a total process time can be shortened by performing the above three steps continuously.

After the constant temperature keeping step $C_1$, irrespective of a temperature in a heat treatment furnace when a wafer is unloaded therefrom and a temperature lowering rate down to the temperature, the temperatures are desirably determined such that no slip is generated owing to thermal stress. For example, after the temperature in the heat treatment furnace is lowered from the $T_8°$ C. to 700° C. at 3° C./min, the wafer can be unloaded from the heat treatment furnace.

In order to sufficiently achieve the effect of the third aspect of the method for manufacturing a silicon wafer of the present invention, oxygen concentration of the silicon wafer to be heat-treated is desirably about 14 ppma to 17 ppma. While at higher oxygen concentration, the density of precipitates becomes higher and a more excellent IG capability can be imparted to the silicon wafer, at excessively high oxygen concentration, precipitates in the vicinity of a surface of the silicon wafer is difficult to be annihilated. Further, at lower oxygen concentration, the density of grown-in precipitation nuclei generated in a growth step of a silicon single crystal becomes lower, and then the density of precipitates becomes lower. However, even at lower oxygen concentration, for example, by lowering the temperature raising initiation temperature $T_6°$ C. in the temperature raising step $A_1$ or reducing the rate of the $R_3°$ C./min, the effect of the third aspect of the method for manufacturing a silicon wafer of the present invention can be achieved.

Furthermore, according to the third aspect of a method for manufacturing a silicon wafer of the present invention, an effect can be achieved that suppresses generation of slip dislocations due to the thermal stress during the device fabrication process. It has been known that the dislocation constituting slip is pinned by an oxide precipitate. Therefore, by generating oxide precipitates each having a large size at high density according to the third aspect of the method for manufacturing a silicon wafer of the present invention, a probability is enhanced that dislocations are pinned, thus generation of slip dislocations being suppressed. That is, the third aspect of the method for manufacturing silicon wafer of the present invention can be especially preferably applied to a large diameter wafer of 300 mm or larger in diameter, which would be subject to generation of slip dislocations by heat treatment.

In order to suppress generation of slip dislocations, the $T_8°$ C. is preferably 1200° C. or lower, more preferably about 1150° C. or lower.

Further, by applying the third aspect of the method for manufacturing a silicon wafer of the present invention to a wafer having a few defects with few COPs and voids which is manufactured from a silicon single crystal pulled in a condition that suppresses generation of void defects in growth thereof, there can be formed an extremely high quality DZ-IG structure having hardly not only oxide precipitates but also COPs and voids. This is especially effective for a 300 mm diameter wafer that is a future main stream from the viewpoint of suppression of generation of slip.

Here, the above described wafer having a few defects can be manufactured by using a known technique that a single crystal is pulled while controlling a ratio V/G between a crystal pulling rate V and a temperature gradient G in the vicinity of a solid liquid interface in a growing crystal as is described in, for example, JP A 99-147786 and JP A 99-157996.

A first aspect of a method for manufacturing a silicon epitaxial wafer of the present invention comprises the steps of: keeping a silicon wafer having grown-in precipitation nuclei generated in a growth step of a silicon single crystal at a temperature $T_9°$ C. in the range of from 500° C. to 700° C. for a prescribed time $t_5$; then raising the temperature of the silicon wafer to $T_{10}°$ C. in the range of from 800° C. to 900° C. at a temperature raising rate $R_5°$ C./min of 5° C./min or less; keeping the wafer at the $T_{10}°$ C. for a prescribed time $t_6$, thereby the grown-in precipitation nuclei being grown to sizes each equal to or larger than one not to be annihilated in a subsequent epitaxial growth step; and thereafter performing epitaxial growth on a surface of the silicon wafer.

Thus, by performing epitaxial growth on a silicon wafer after grown-in precipitation nuclei have been grown to sizes not to be annihilated in an epitaxial growth step, oxide precipitates each which is not so large as to have a sufficient IG capability immediately after the epi step but grown to a size having an IG capability during a device fabrication process after the epi step, so that an excellent IG capability is imparted to the silicon epitaxial wafer.

While the temperature $T_{10}°$ C. may be higher than about 900° C., there become longer a time required for raising temperature and a time for a temperature lowering step after the keeping step at the $T_{10}°$ C. Furthermore, when the $T_{10}°$ C. is lower than about 800° C., a growth rate of an oxide precipitate is slowed down; therefore, there is a longer time required for growing oxide precipitates to sizes not to be annihilated in the epitaxial growth step, thereby a total process time being longer.

The lower the temperature $T_9°$ C. is, the higher the density of precipitates becomes, but a process time lengthens; the $T_9°$ C. is preferably about 500° C. or higher. If the $T_9°$ C. is more than about 700° C., there are occasions where the density of precipitates cannot be sufficiently attained. Likewise, the lower the temperature raising rate $R_5°$ C./min is, the higher the density of precipitates becomes, but at an excessively low rate of the $R_5°$ C./min, a process time becomes longer; the $R_5°$ C./min is preferably about 1° C./min or more. When the temperature raising rate $R_5°$ C./min is a high rate in excess of about 5° C./min, the proportion of grown-in precipitation nuclei that are annihilated without growth becomes higher, so that there are occasions where the density of precipitates cannot be sufficiently achieved.

By setting the temperature raising rate from the $T_9°$ C. to the $T_9°$ C. to 5° C./min or less, grown-in precipitation nuclei can be efficiently grown, annihilation thereof being suppressed to the lowest level possible. That is, since existing grown-in precipitation nuclei generated in the crystal growth step are grown, the density of precipitates can be sufficiently enhanced even without a heat treatment step for generating new oxygen precipitation nuclei, yet a total process time can be shortened.

In the first aspect of the method for manufacturing a silicon epitaxial wafer of the present invention, prior to temperature raising from the $T_9°$ C. to the $T_{10}°$ C., the keeping time $t_5$ at the $T_9°$ C. may be 0 min without hindrance, but more preferably 15 min or longer. Thereby, grown-in precipitation nuclei are harder to be annihilated in a temperature raising step, and furthermore, new oxygen precipitation nuclei can be generated in addition to the existing grown-in precipitation nuclei; oxygen precipitation nuclei of higher density may be generated. Since a process time becomes longer when the keeping time $t_5$ is long, the keeping time $t_5$ is preferably 20 about 60 min or shorter.

Further, the lower the temperature $T_9°$ C. is or the longer the keeping time $t_5$ at the $T_9°$ C. is or the slower the $R_5°$ C./min is, the more the new precipitation nuclei generated during the temperature raising step become; the density of precipitates becomes higher.

The keeping time $t_6$ at the $T_{10}°$ C. is preferably about 30 min or longer in order to certainly grow the grown-in precipitation nuclei to each of a size (about 3 nm to 4 nm) equal to or larger than one not to be annihilated in a subsequent epitaxial growth step performed at a high temperature on the order of 1050° C. to 1200° C. The sizes ranging from 3 nm to 4 nm are critical sizes in diameter at an epi step temperature of 1150° C., which have been calculated according to a classical theory. The longer the keeping time $t_6$ is, the larger the sizes of oxide precipitates become, but the process time also lengthens; the keeping time $t_8$ is preferably about 4 hrs or shorter, more preferably about 2 hrs or shorter. On the other hand, when the keeping time $t_6$ is shorter than about 30 min, due to slight fluctuations in time, chances are that an oxide precipitate having a desired size cannot be generated. If the keeping time $t_6$ is 0 min, growth of grown-in precipitation nuclei is insufficient; therefore, the proportion of the grown-in precipitation nuclei that are annihilated in the epi step becomes higher, so that there is decreased the density of oxide precipitates detectable after the device fabrication process.

In order to sufficiently achieve the effect of the first aspect of the method for manufacturing a silicon epitaxial wafer of the present invention, oxygen concentration of the silicon wafer to be heat-treated is desirably about 16 ppma or higher. At the higher oxygen concentration, the density of precipitates becomes higher; a more excellent IG capability can be imparted to the silicon wafer. The higher the oxygen concentration is, the faster the growth rate of precipitates becomes; a total process time becomes shorter. However, even at lower oxygen concentration, for example, by lowering the temperature raising initiation temperature $T_9°$ C. in the temperature raising step, or lengthening the keeping time at the $T_{10}°$ C., there can be achieved the effect of the first aspect of the method for manufacturing a silicon epitaxial wafer of the present invention. Accordingly, while no specific limitation is put on the upper limit of oxygen concentration in the first aspect of the method for manufacturing a silicon epitaxial wafer of the present invention, it is preferably about 23 ppma or less in consideration for the ease in production of silicon single crystals.

From the above description, according to the first aspect of the method for manufacturing a silicon epitaxial wafer of the present invention, a silicon epitaxial wafer having an excellent gettering capability can be efficiently obtained.

A second aspect of a method for manufacturing a silicon epitaxial wafer of the present invention comprises the steps of: keeping a silicon wafer having grown-in precipitation nuclei generated in a growth step of a silicon single crystal at a temperature $T_{11}°$ C. in the range of from 500° C. to 700°

C. for a prescribed time $t_7$; then raising the temperature of the silicon wafer to $T_{12}$° C. in the range of from 1000° C. to 1100° C. at a temperature raising rate $R_6$° C./min of 5° C./min or less; keeping the wafer at the $T_{12}$° C. for a prescribed time $t_8$, thereby the grown-in precipitation nuclei being grown into oxide precipitates of sizes each equal to or larger than one having a gettering capability; and thereafter, performing epitaxial growth on a surface of the silicon wafer.

Thus, by performing an epitaxial growth after the grown-in precipitation nuclei have been grown into oxide precipitates of sizes each equal to or larger than one having a gettering capability, no re-dissolution of oxide precipitates occurs during an epitaxial growth step; there is obtained a silicon epitaxial wafer having oxide precipitates of sizes each having a gettering capability generated prior to loading it into a device fabrication process.

Here, as for a size of an oxide precipitate having an IG capability, there is used as a guideline the size of the oxide precipitate detectable experimentally (about 30 nm to 40 nm in diameter). Generally, even the oxide precipitate of the size non-detectable experimentally is considered as having an IG capability, so it is possible to infer that the oxide precipitate of the size detectable experimentally has a sufficient IG capability. Accordingly, the size having a gettering capability is preferably about 40 nm or larger in diameter. If the size of the oxide precipitate is equal to or larger than this value, it is not annihilated during the epitaxial step, the IG capability being kept sufficiently. While no specific limitation is put on the upper limit of a size of an oxide precipitate, since a heat treatment time becomes longer in order to grow it to a larger size, it is preferably 100 nm or less in diameter.

When the $T_{12}$° C. is lower than about 1000° C., a time for obtaining large oxide precipitates becomes longer and hence a total process time lengthens. The higher the $T_{12}$° C. is, the shorter the time for growing large oxide precipitates becomes; a total process time may be shorter, but in order to sufficiently suppress generation of slip dislocations in the heat treatment or in a subsequent epi step, the $T_{12}$° C. is preferably 1100° C. or lower.

The lower the temperature $T_{11}$° C. is, the higher the density of precipitates becomes, but a process time lengthens; the $T_{11}$° C. is preferably about 500° C. or higher. Also, when the $T_{11}$° C. is in excess of about 700° C., there are occasions where the density of precipitates is not sufficiently high. Likewise, while the slower the temperature raising rate $R_6$° C./min is, the higher the density of precipitates becomes, but an excessively slow rate causes a process time to be too long; the $R_6$° C./min is preferably about 1° C./min or more. If the temperature raising rate $R_6$° C./min is a high rate in excess of about 5° C./min, the proportion of grown-in precipitation nuclei that are annihilated without growth becomes higher, so that there are occasions where the density of precipitates cannot be sufficiently achieved.

By setting the temperature raising rate $R_6$° C./min from the $T_{11}$° C. to the $T_{12}$° C. to 5° C./min or less, grown-in precipitation nuclei can be efficiently grown, annihilation thereof being suppressed to the lowest level possible. That is, since existing grown-in precipitation nuclei generated in a crystal growth step are grown, the density of precipitates can be sufficiently enhanced even without a heat treatment step for generating new oxygen precipitation nuclei, yet a total process time can be shortened.

In the second aspect of the method for manufacturing a silicon epitaxial wafer of the present invention, prior to raising temperature from the $T_{11}$° C. to the $T_{12}$C., the keeping time $t_7$ at the $T_{11}$° C. may be 0 min without hindrance, but more preferably 15 min or longer. Thereby, the grown-in precipitation nuclei are harder to be annihilated in the temperature raising step, and furthermore, new oxygen precipitation nuclei can be generated in addition to the existing grown-in precipitation nuclei; oxygen precipitation nuclei of higher density may be generated. Further, since a process time becomes longer when the keeping time $t_7$ is long, the keeping time $t_7$ is preferably about 60 min or shorter.

Note that the lower the temperature $T_{11}$° C. is or the longer the keeping time $t_7$ at the $T_{11}$° C. is or the slower the temperature raising rate is, he more the new precipitation nuclei are generated during the temperature raising step; the density of precipitates becomes higher.

The keeping time $t_8$ at the temperature $T_{12}$° C. is preferably about 30 min or longer in order to certainly grow the grown-in precipitation nuclei to sizes each having a gettering capability. The longer the keeping time $t_8$ is, the larger the sizes of oxide precipitates becomes, but the process time lengthens; the keeping time $t_8$ is preferably about 4 hrs or shorter, more preferably about 2 hrs or shorter. On the other hand, when the keeping time $t_8$ is shorter than about 30 min, due to slight fluctuations in time, chances are that no oxide precipitates having desired sizes can be achieved.

In order to sufficiently obtain the effect of the second aspect of the method for manufacturing a silicon epitaxial wafer of the present invention, oxygen concentration of a silicon wafer to be heat-treated is preferably about 16 ppma or higher. At the higher oxygen concentration, the density of precipitates becomes higher; a more excellent IG capability can be imparted to the silicon wafer. Further, the higher the oxygen concentration is, the faster the growth rate of the precipitates becomes; a total process time can be shorter. However, it is easily inferred that even when the oxygen concentration is low, for example, by lowering the temperature raising initiation temperature $T_{11}$° C. in the temperature raising step, or lengthening the keeping time at the $T_{12}$° C., it would be conceived that there can be achieved the effect of the second aspect of the method for manufacturing a silicon epitaxial wafer of the present invention. Accordingly, no specific limitation is put on the upper limit of the oxygen concentration in the second aspect of the method for manufacturing a silicon epitaxial wafer of the present invention, but it is preferably about 23 ppma or less in consideration for the ease in production of silicon single crystals.

From the above description, according to the second aspect of the method for manufacturing a silicon epitaxial wafer of the present invention, a silicon epitaxial wafer having an excellent gettering capability can be efficiently obtained.

As an additional effect of the second aspect of the method for manufacturing a silicon epitaxial wafer of the present invention, there can be given an effect to suppress generation of slip dislocations due to the thermal stress during a device fabrication process. It has been known that a dislocation constituting slip is pinned by an oxide precipitate. Therefore, by generating oxide precipitates each having a certain large size at high density prior to loading a silicon epitaxial wafer into a device fabrication process according to the second aspect of the method for manufacturing a silicon epitaxial wafer of the present invention, a probability is enhanced that dislocations are pinned, thus suppressing generation of slip dislocations. Accordingly, this is especially effective for a 300 mm wafer (epitaxial wafer) that is the future mainstream.

In a first aspect of a silicon epitaxial wafer of the present invention, density of oxide precipitates detected in the bulk thereof prior to the heat treatment at 1000° C. for 2 hrs is less than $1 \times 10^9/cm^3$ and density of oxide precipitates detected in the bulk thereof after the heat treatment at 1000° C. for 2 hrs is equal to or higher than $1 \times 10^9/cm^3$.

Thus, according to the first aspect of the silicon epitaxial wafer of the present invention, in the silicon epitaxial wafer subjected to the heat treatment at 1000° C. for 2 hrs simulating a device fabrication process with a lower temperature and a shorter time, the density of oxide precipitates of sizes each surely having a gettering capability (about 40 nm or more in diameter detectable by means of an optical measuring instrument) is $1 \times 10^9/cm^3$ or higher, so that it has a sufficient gettering capability in a device fabrication process with a low temperature and a short time. Note that the higher the density of oxide precipitates is, the more excellent the IG capability becomes, but the wafer strength may be reduced due to a decrease in dissolved oxygen concentration and hence the density of oxide precipitates after the heat treatment at 1000° C. for 2 hrs is preferably $1 \times 10^{12}/cm^3$ or lower.

In a second aspect of a silicon epitaxial wafer of the present invention, density of oxide precipitates detected in the bulk thereof in a non-heat treatment state after formation of an epitaxial layer is $1 \times 10^9/cm^3$ or more.

Thus, according to the second aspect of the silicon epitaxial wafer of the present invention, in the silicon epitaxial wafer being in a non-heat treatment state (the non-heat treatment means that any heat treatment is not applied after the epitaxial growth) prior to loading the silicon epitaxial wafer into a device fabrication process with a low temperature and a short time, the density of oxide precipitates of sizes each surely having a gettering capability (about 40 nm or more in diameter and preferably 100 nm or less in diameter detectable by means of an optical measuring instrument) is $1 \times 10^9/cm^3$ or higher, so that it has a sufficient gettering capability in a device fabrication process with a low temperature and a short time from the initial stage thereof. Note that the higher the density of oxide precipitates, the more excellent the IG capability, but the wafer strength may be reduced due to a decrease in solution oxygen concentration and hence the above density of oxide precipitates is preferably $1 \times 10^{12}/cm^3$ or lower.

BEST MODE FOR CARRYING OUT THE INVENTION

Detailed description will be given of embodiments of the present invention with reference to the accompanying drawings and it is needless to say that in addition to examples in the figures various modification or variations may be made without departing from the technical concept of the present invention.

Figure 1:
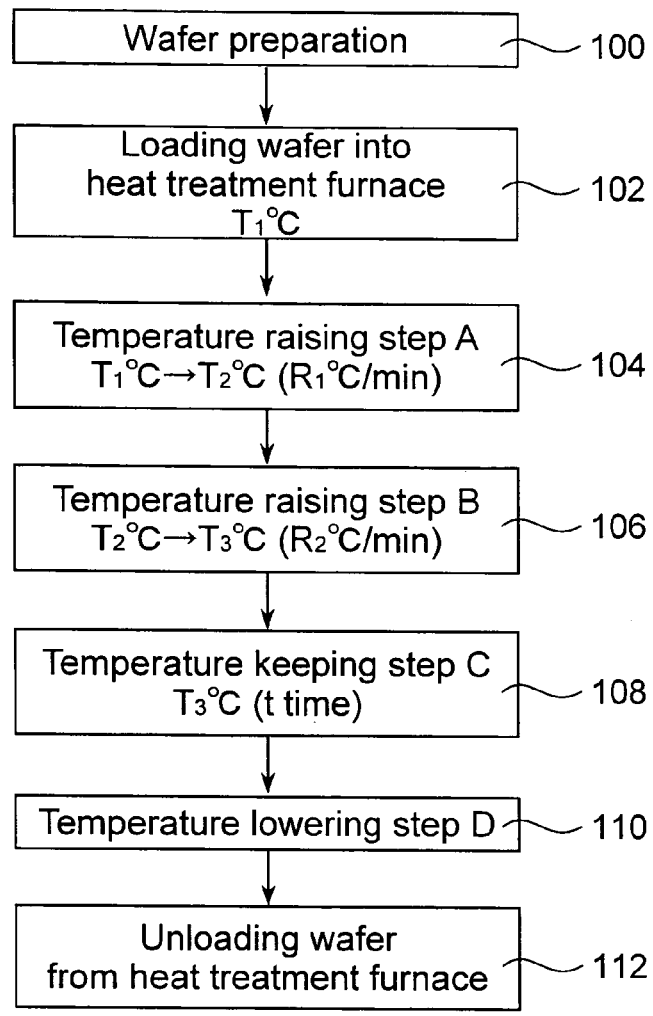
FIG. 1 is a flow chart showing an example of step orders of a first aspect of a method for manufacturing a silicon wafer of the present invention.
Figure 2:
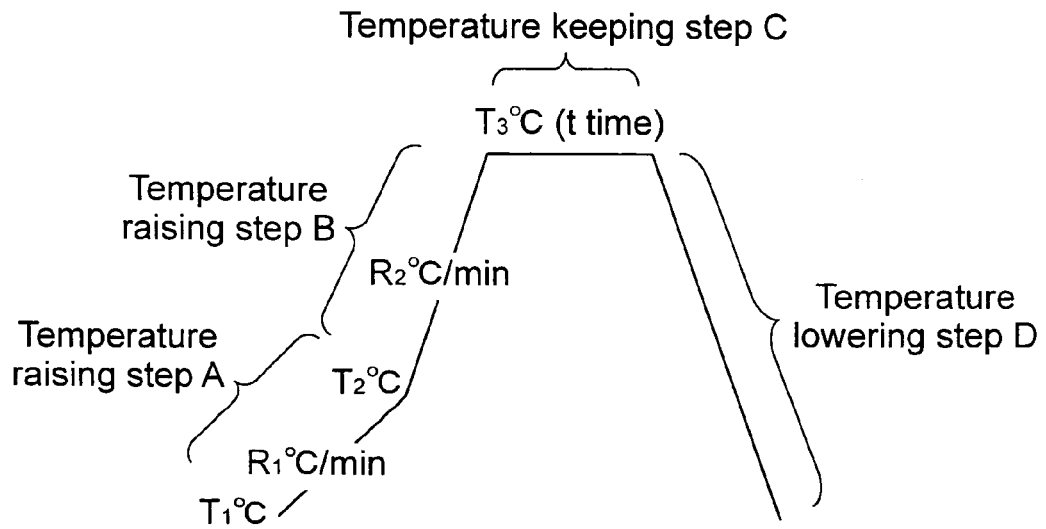
FIG. 2 is a descriptive schematic view showing essential parts of the step order of FIG. 1.

FIG. 1 is a flow chart showing an example of step orders of a first aspect of a method for manufacturing a silicon wafer of the present invention and FIG. 2 is a descriptive schematic view showing essential parts of the step order of FIG. 1. The first aspect of the method for manufacturing a silicon wafer of the present invention, as shown in FIGS. 1 and 2, comprises the following indispensable three steps: a temperature raising step A for generating oxygen precipitation nuclei (step 104); a temperature raising step B for growing the oxygen precipitation nuclei (step 106); and a constant temperature keeping step C for growing the oxygen precipitation nuclei into oxide precipitates of larger sizes (step 108). Note that in FIGS. 1 and 2, there is shown a preferable case where the temperature raising step A (104), the temperature raising step B (106) and the constant temperature keeping step C (108) are continuously performed.

As shown in FIG. 1, at first a wafer to be heat-treated is prepared (step 100). The wafer is loaded into a heat treatment furnace kept at $T_1°$ C. (step 102). Here, the $T_1°$ C. is preferably about 650° C. or lower. Then, as well shown in FIG. 2, a temperature in the furnace is raised from the $T_1°$ C. to $T_2°$ C. at a rate of $R_1°$ C./min (a temperature raising step A: step 104). Here, it is preferably that the $T_2°$ C. is about 700° C. or higher and the $R_1°$ C./min is about 1.5° C./min or lower. In the temperature raising step A (step 104), oxygen precipitation nuclei can be formed at high density. Thereby, even in a wafer containing almost no oxygen precipitation nuclei at a stage prior to heat treatment, oxygen precipitation nuclei can be generated at high density. In a wafer containing oxygen precipitation nuclei in advance, oxygen precipitation nuclei can be generated at higher density.

If there is a desire for changing the density of oxide precipitates to a level of contamination in a device fabrication process, the density can be easily changed, for example, by setting the $T_2°$ C. to about 750° C. and the $R_1°$ C./min to about 1° C./min, and changing the $T_1°$ C.

Then, a temperature in the heat treatment furnace is raised from the $T_2°$ C. to $T_3°$ C. at a rate of $R_2°$ C./min (a temperature raising step B: step 106). Here, it is preferable that the $T_3°$ C. is about 1000° C. or higher and the $R_2°$ C./min is the $R_1°$ C./min or higher and about 7° C./min or lower. In the temperature raising step B (step 106), oxygen precipitation nuclei generated in the previous step can be efficiently grown.

Note that, if the temperature raising rates $R_1°$ C./min and $R_2°$ C./min in the temperature raising steps A and B are constant, respectively, the temperature raising steps become preferably uncomplicated, but it is possible to switch the temperature raising rates in the course of the respective steps. For example, in the temperature raising step B, temperature raising is initiated at the temperature raising rate $R_2°$ C./min and at a temperature prior to reaching the $T_3°$ C. the temperature raising rate may be switched to a temperature raising rate higher than the $R_2°$ C./min, and thereby it is possible to shorten a process time to some extent.

Then, the wafer is kept at the $T_3°$ C. for t time (a constant temperature keeping step C: step 108). Here, it is preferable that the $T_3°$ C. is about 1000° C. or higher and the t time is about 1 hr or longer. In the constant temperature keeping step C (step 108), minute oxide precipitates generated in the previous temperature raising steps A and B can be grown into large oxide precipitates each having an IG capability. Thus, it is an object of the constant temperature keeping step C to further grow precipitates generated (grown) in the previous steps. Therefore, as far as the object can be achieved, this step is not limited literally to keeping a constant temperature but can be modified to a step accompanied with some temperature changes (raising or lowering temperatures or the like).

Furthermore, by changing the $T_3°$ C. and the t time in the constant temperature keeping step C (step 108), sizes of oxide precipitates can be easily changed. It is considered that the larger the sizes of oxide precipitates are, the higher the IG capability becomes, but a process time lengthens. Therefore, in order to attain efficiently oxide precipitates of necessary sizes, there is important the effect that the sizes are easily changeable.

Here, when manufacturing a silicon wafer loaded into a device fabrication process in which no growth of oxide precipitates is expected, the $T_3°$ C. in the constant temperature keeping step C is preferably 1000° C. or higher, but when the present invention is applied in the case where using a device fabrication process in which growth of oxide precipitates can be expected, oxide precipitates are not required to be experimentally detected after heat treatment, the $T_3°$ C. in the constant temperature keeping step may be 1000° C. or lower, for example, 800° C.

After the above heat treatment, for example, a temperature in the heat treatment furnace is lowered from the $T_3°$ C. to 800° C. at a temperature lowering rate of 2° C./min (a temperature lowering step D: step 110), and after that the wafer is unloaded from the heat treatment furnace (step 112).

In order to sufficiently achieve the effect of the heat-treating method of the present invention, oxygen concentration of a silicon wafer is desirably about 17 ppma or higher. When the oxygen concentration is higher, the nucleus generating rate and the nucleus growth rate are faster, so a total process time is shorter.

Figure 3:
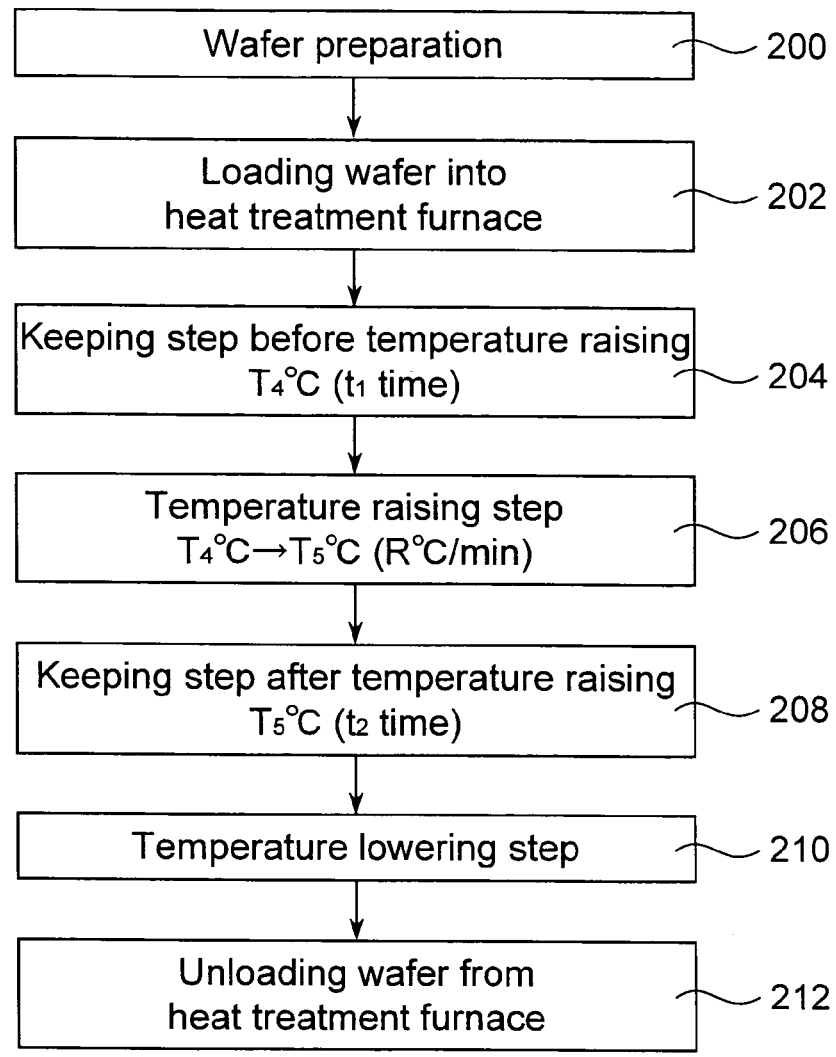
FIG. 3 is a flow chart showing an example of step orders of a second aspect of a method for manufacturing a silicon wafer of the present invention.
Figure 4:
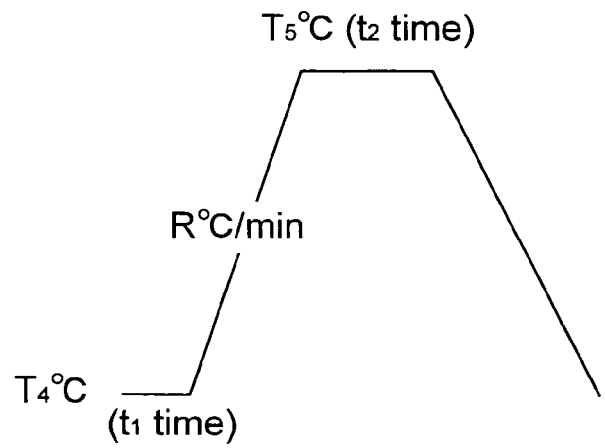
FIG. 4 is a descriptive schematic view showing essential parts of the step order of FIG. 3.

FIG. 3 is a flow chart showing an example of step orders of a second aspect of a method for manufacturing a silicon wafer of the present invention and FIG. 4 is a descriptive schematic view showing essential parts of the step order of FIG. 3.

As shown in FIG. 3, at first there is prepared a wafer having grown-in precipitation nuclei to be heat-treated (step 200). The wafer can be obtained by processing a silicon single crystal grown by means of an ordinary CZ method. The wafer is loaded into a heat treatment furnace (step 202). The heat treatment furnace is maintained at $T_4°$ C. (500° C. to 700° C.) and prior to the next temperature raising step, the loaded wafer is kept at the $T_4°$ C. for a prescribed time ($t_1$ time), preferably for 15 min or longer (a keeping step before temperature raising: step 204). Then, as well shown in FIG. 4, a furnace temperature is raised from the $T_4°$ C. to $T_5°$ C. set in the range of from 1000° C. to 1230° C. at a temperature raising rate R° C./min of 5° C./min or less (a temperature raising step: step 206). In the temperature raising step (step 206), grown-in precipitation nuclei of high density can be effectively grown without annihilation.

If there is a desire for changing the density of oxide precipitates to a level of contamination in a device fabrication process, the density can be easily changed, for example, by setting the $T_5°$ C. to about 1100° C. and the temperature raising rate R° C./min to about 3° C./min, and changing the $T_4°$ C.

Then, the wafer is kept at the $T_5°$ C. for a prescribed time ($t_2$ time) (a keeping step after temperature raising: step 208). Here, the keeping time is preferably about 30 min or longer. In the keeping step after temperature raising (step 208), minute oxide precipitates in the bulk of a wafer grown-in the previous temperature raising step (step 206) can be grown into oxide precipitates of desired sizes each on the order of from 30 nm to 40 nm in diameter, preferably about 50 nm or larger, and at the same time, by out-diffusing oxygen in the vicinity of a surface of the wafer, oxygen precipitation nuclei can be annihilated, so that a DZ layer free of oxide precipitates can be formed.

Thus, it is an object of the keeping step after temperature raising (step 208) at the $T_5°$ C. to further grow oxide precipitates in the bulk of the wafer grown-in the temperature raising step (step 206) and to out-diffuse oxygen in the vicinity of a surface of the wafer. Therefore, as far as the object can be achieved, this step is not limited to keeping a constant temperature but can be modified to a step accompanied with some temperature changes (raising or lowering temperatures or the like). Furthermore, by changing the $T_5°$ C. and the keeping time $t_2$ in the keeping step after temperature raising (step 208), sizes of oxide precipitates can be easily changed.

Note that the wafer to be heat-treated is irrespective of the presence or absence of addition of impurities and concentration of impurities. For example, even a nitrogen-doped wafer can achieve an almost similar effect to a nitrogen un-doped wafer.

After the above heat treatment, for example, a temperature in the heat treatment furnace is lowered from $T_5°$ C. to 700° C. at a rate of 2° C./min (a temperature lowering step: step 210), and after that the wafer is unloaded from the heat treatment furnace (step 212). Note that no specific limitation is put on the temperature lowering rate and the lowest temperature after the temperature has been lowered.

No specific limitation is put on atmosphere in the above heat treatment. For example, there can be applied oxygen atmosphere, mixed atmosphere of oxygen and nitrogen, argon atmosphere, hydrogen atmosphere and others. In case of non-oxidative atmosphere such as argon and hydrogen, no oxide film is formed on a surface of a wafer; therefore out-diffusion of oxygen may be more preferably accelerated as compared with in case of oxidative atmosphere.

In order to sufficiently achieve the effect of the heat-treating method of the present invention, oxygen concentration in a silicon wafer to be heat-treated is desirably about 16 ppma or higher. The higher the oxygen concentration, the higher the density of precipitates; it is possible to impart a more excellent IG capability to a wafer. Furthermore, the higher the oxygen concentration, the faster the growth rate of precipitates; a total process time becomes shorter.

Figure 5:
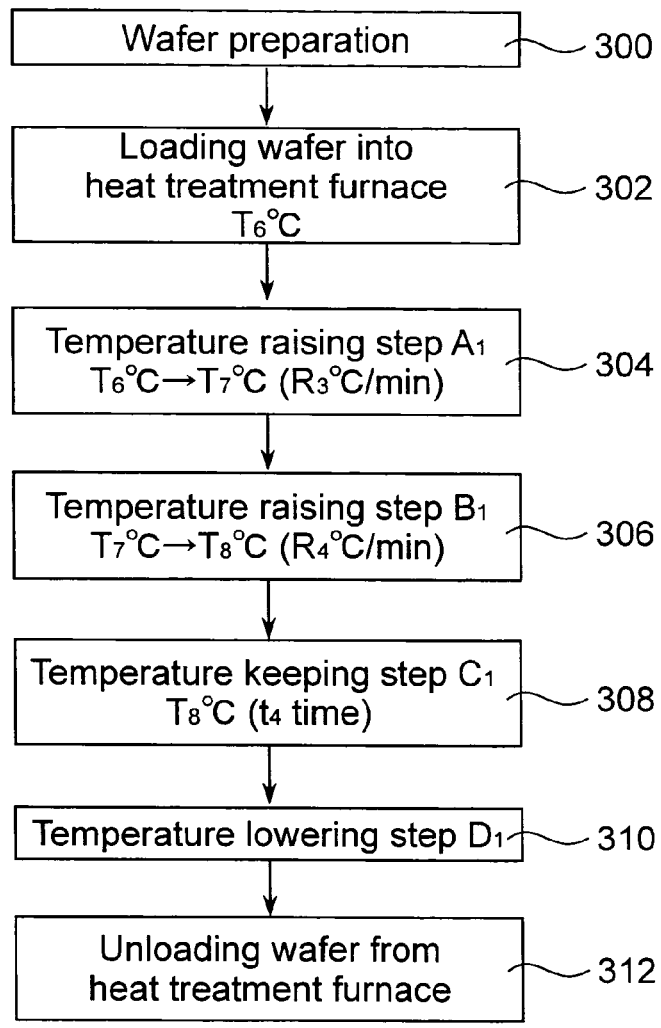
FIG. 5 is a flow chart showing an example of step orders of a third aspect of a method for manufacturing a silicon wafer of the present invention.
Figure 6:
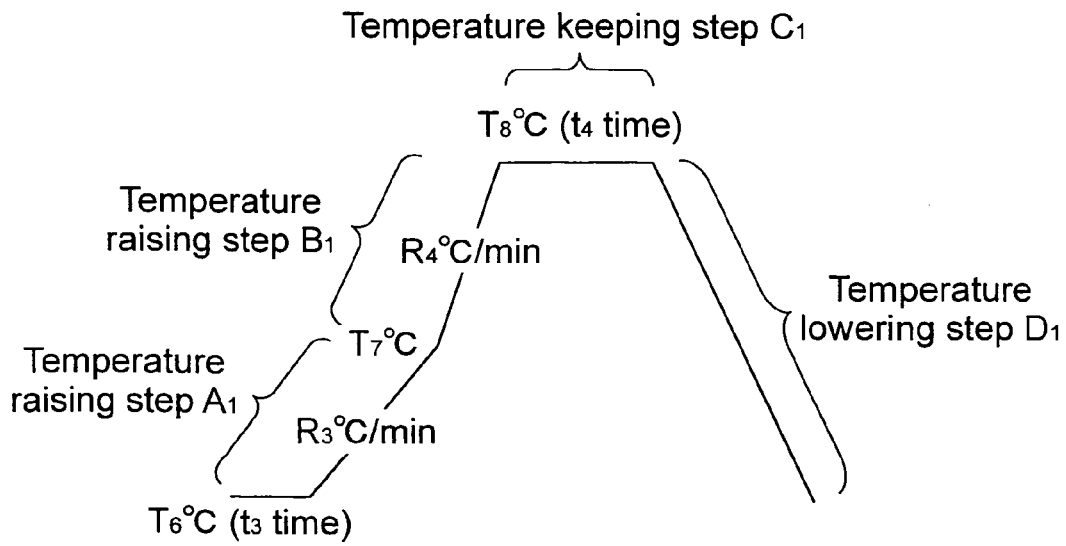
FIG. 6 is a descriptive schematic view showing essential parts of the step order of FIG. 5.

FIG. 5 is a flow chart showing an example of step orders of a third aspect of a method for manufacturing a silicon wafer of the present invention, and FIG. 6 is a descriptive schematic view showing essential parts of the step order of FIG. 5. The third aspect of the method for manufacturing a silicon wafer of the present invention, as shown in FIGS. 5 and 6, comprises the following three indispensable steps: a temperature raising step $A_1$ for growing grown-in precipitation nuclei generated in a silicon single crystal growth step (step 304); a temperature raising step $B_1$ for efficiently raising a temperature to a higher keeping temperature (step 306); and a constant temperature keeping step $C_1$ for growing the grown-in precipitation nuclei to oxide precipitates of sizes each equal to or larger than one having a gettering capacity and for out-diffusing oxygen in the vicinity of a surface of the silicon wafer (step 308). Note that in FIGS. 5 and 6, there is shown a preferable case where the temperature raising step $A_1$ (step 304), the temperature raising step $B_1$ (step 306) and the constant temperature keeping step $C_1$ (step 308) are continuously performed.

As shown in FIG. 5, at first there is prepared a wafer having grown-in precipitation nuclei to be heat-treated (step 300). This wafer can be obtained by processing a silicon single crystal grown by means of an ordinary CZ method. The wafer is loaded into a heat treatment furnace maintained at $T_6°$ C. (step 302). Here, the $T_6°$ C. is preferably 700° C. or lower. Then, as well shown in FIG. 6, a temperature in the heat treatment furnace is raised from the $T_6°$ C. to $T_7°$ C. at a rate of $R_3°$ C./min (a temperature raising step $A_1$: step 304). Here, it is preferable that the $T_7°$ C. is 800° C. to 1000° C. and the $R_3°$ C./min is 3° C./min or less. Furthermore, prior to temperature raising from the $T_6°$ C. to the $T_7°$ C. in the temperature raising step $A_1$ (step 304), a keeping time $t_3$ at the $T_6°$ C. may be 0 min without hindrance, but more preferably 30 min or longer. In the temperature raising step $A_1$ (step 304), grown-in precipitation nuclei of high density can be efficiently grown without annihilation.

Then, a temperature in the heat treatment furnace is raised from the $T_7°$ C. to $T_8°$ C. at a rate of $R_4°$ C./min (a temperature raising step $B_1$: step 306). Here, it is preferable that the $T_8°$ C. is 1050° C. to 1230° C. and the $R_4°$ C./min is 5° C./min or more. In the temperature raising step $B_1$ (step 306), by raising a temperature to a higher keeping temperature for a short time, there is avoided growth of more precipitates than necessary so that precipitates in the vicinity of a surface of the wafer can be easily annihilated.

Then, the wafer is kept at the $T_8°$ C. for $t_4$ time (a constant temperature keeping step $C_1$: step 308). Here, it is preferable that the $T_8°$ C. is 1050° C. to 1230° C. and the $t_4$ time is about 30 min or longer. In the constant temperature keeping step $C_1$ (step 308), minute oxide precipitates in the bulk of the wafer grown-in the previous temperature raising steps (steps 304 and 306) are grown into oxide precipitates of desired sizes each of about 40 nm or larger in diameter and preferably about 50 nm or larger, and at the same time, by out-diffusing oxygen in the vicinity of a surface of the wafer, oxide precipitates are annihilated, so that a DZ layer free of oxide precipitates can be formed.

In this case, as compared with a DZ layer formed in the second aspect of the present invention, oxide precipitates in the vicinity of the surface region of a wafer can be annihilated more perfectly; therefore, an extremely high quality DZ layer can be efficiently obtained.

Thus, it is an object of the constant temperature keeping step $C_1$ at the $T_8°$ C. (step 308) to further grow oxide precipitates in the bulk of the wafer grown-in the temperature raising steps (steps 304 and 306) and to out-diffuse oxygen in the vicinity of a surface of the wafer. Therefore, as far as the purposes can be achieved, the constant temperature keeping step $C_1$ is not limited to keeping a wafer at a constant temperature but the step can be modified to a step accompanied with some temperature changes (raising or lowering temperatures or the like). Furthermore, by changing the $T_8°$ C. and the keeping time $t_4$ in the constant keeping step $C_1$ (step 308), sizes of oxide precipitates and a DZ width can be easily changed.

Note that the wafer to be heat-treated is irrespective of the presence or absence of addition of impurities and concentration of impurities. For example, even a nitrogen-doped wafer can achieve an almost similar effect to a nitrogen un-doped wafer.

After the above heat treatment, for example, a temperature in the heat treatment furnace is lowered from the $T_8°$ C. to 700° C. at 3° C./min (a temperature lowering step $D_1$: step 310), and after that the wafer is unloaded from the heat treatment furnace (step 312). Note that no specific limitation is put on the temperature lowering rate and the lowest temperature after the temperature has been lowered.

No specific limitation is put on atmosphere in the above heat treatment. For example, there can be applied oxygen atmosphere, mixed atmosphere of oxygen and nitrogen, argon atmosphere, hydrogen atmosphere and others. In case of non-oxidative atmosphere such as argon and hydrogen, no oxide film is formed on a surface of a wafer; therefore out-diffusion of oxygen may be more preferably accelerated as compared with in case of oxidative atmosphere.

In order to sufficiently achieve the effect of the third aspect of the method for manufacturing a silicon wafer of the present invention, oxygen concentration in a silicon wafer to be heat-treated is desirably about 14 ppma to 17 ppma. When the oxygen concentration is higher, the density of precipitates is raised; it is possible to impart a more excellent IG capability to a wafer, but if the oxygen concentration is excessively high, precipitates in the vicinity of a surface of the wafer are hard to be annihilated. On the other hand, when the oxygen concentration is lower, the density of grown-in precipitates generated in a silicon single crystal growth step becomes lower; the density of precipitates is reduced. However, even when oxygen concentration is low, for example, by lowering the temperature raising initiation temperature $T_6°$ C. or slowing the $R_3°$ C./min in the temperature raising step $A_1$, the effect of the third aspect of the method for manufacturing a silicon wafer of the present invention can be achieved.

Figure 7:
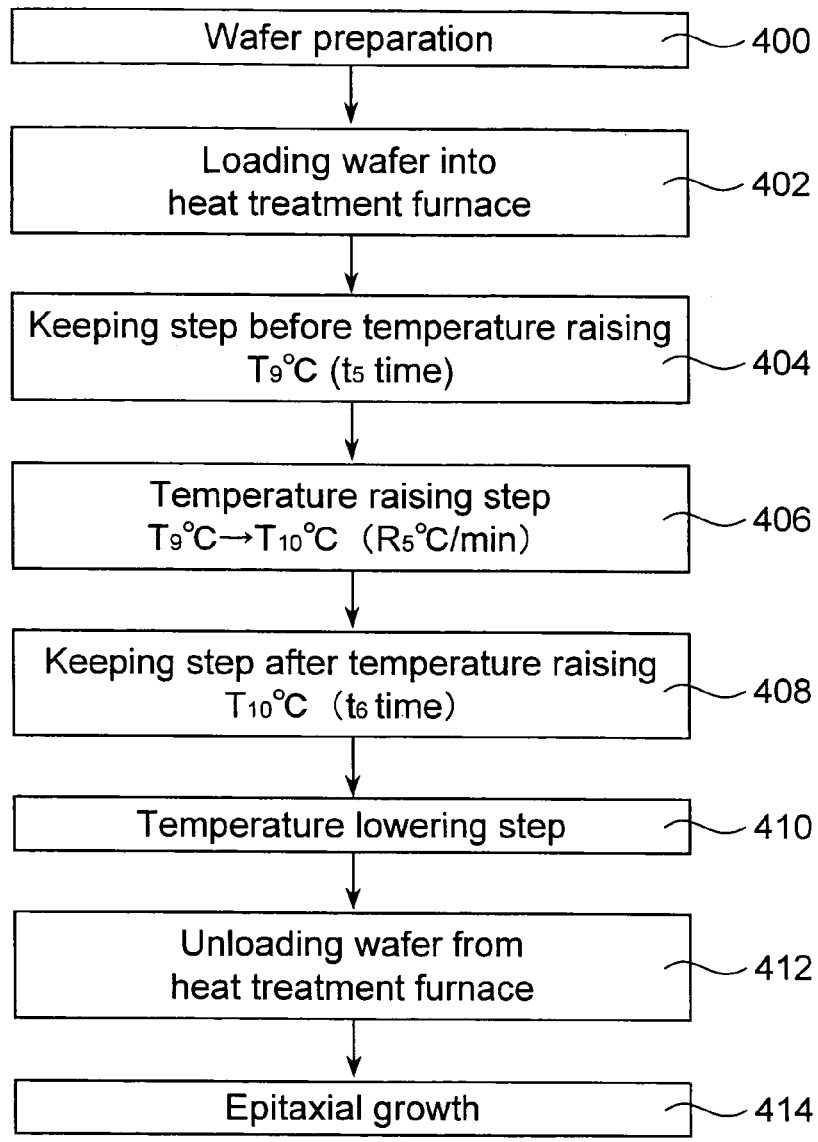
FIG. 7 is a flow chart showing an example of step orders of a first aspect of a method for manufacturing a silicon epitaxial wafer of the present invention.
Figure 8:
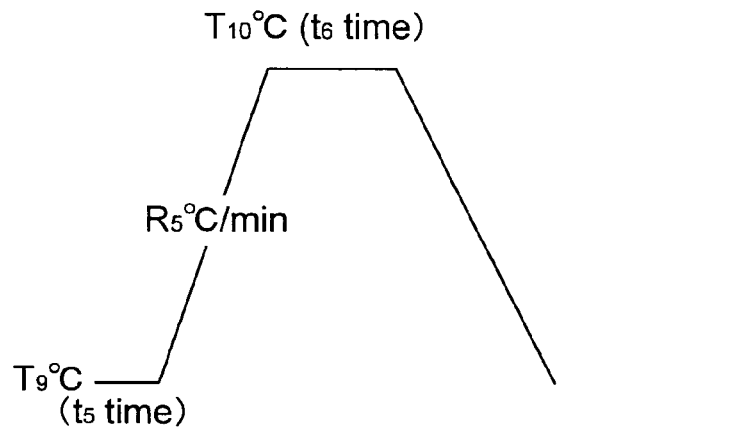
FIG. 8 is a descriptive schematic view showing essential parts of the step order of FIG. 7.

FIG. 7 is a flow chart showing an example of step orders of a first aspect of a method for manufacturing a silicon epitaxial wafer of the present invention and FIG. 8 is a descriptive schematic view showing essential parts of the step order of FIG. 7.

As shown in FIG. 7, at first there is prepared a wafer having grown-in precipitation nuclei to be heat-treated (step 400). This wafer can be obtained by processing a silicon single crystal grown by means of an ordinary CZ method. The wafer is loaded into a heat treatment furnace (step 402). The heat treatment furnace is maintained at $T_9°$ C. (500° C. to 700° C.) and the loaded wafer is kept at the $T_9°$ C. for a prescribed time ($t_5$ time), preferably 15 min or longer, prior to performing the next temperature raising step (a keeping step before temperature raising: step 404). Then, as well shown in FIG. 8, a temperature in the heat treatment furnace is raised from the $T_9°$ C. to $T_{10}$ set in the range of from 800° C. to 900° C. at a temperature raising rate $R_5°$ C./min of 5° C./min or less (a temperature raising step: step 406). In the temperature raising step (step 406), grown-in precipitation nuclei of high density can be efficiently grown without annihilation.

If there is a desire for changing the density of oxide precipitates to a level of contamination in a device fabrication process, the density can be easily changed, for example, by setting the $T_{10}°$ C. to about 800° C. and the temperature raising rate $R_5°$ C./min to about 3° C./min, and changing the $T_9°$ C.

Then, the wafer is kept at the $T_{10}°$ C. for a prescribed time ($t_6$ time) (a keeping step after temperature raising: step 408). Here, the keeping time is preferably about 30 min or longer. In the keeping step after temperature raising (step 408), minute oxide precipitates grown-in the previous temperature raising step (step 406) can be grown into oxide precipitates of desired sizes each of 30 nm to 40 nm, preferably 50 nm or larger. Thus, it is an object of the keeping step after temperature raising (step 408) at the $T_{10}°$ C. to further grow oxide precipitates grown-in the temperature raising step (step 406). Therefore, as far as the object can be achieved, this step is not limited to keeping a constant temperature but can be modified to a step accompanied with some temperature changes (raising or lowering temperatures or the like).

Furthermore, by changing the $T_{10}°$ C. and the keeping time $t_6$ in the keeping step after temperature raising (step 408), sizes of oxide precipitates can be easily changed.

Note that the wafer to be heat-treated is irrespective of the presence or absence of addition of impurities and concentration of impurities. For example, even a nitrogen-doped wafer can achieve an almost similar effect to a nitrogen un-doped wafer.

After the above heat treatment, for example, a temperature in the heat treatment furnace is lowered from the $T_{10}°$ C. to 700° C. at a rate of 2° C./min (a temperature lowering step: step 410), and after that the wafer is unloaded from the heat treatment furnace (step 412). Note that no specific limitation is put on the temperature lowering rate and the lowest temperature after the temperature has been lowered.

Then, if required, there are performed such processes as wafer cleaning and oxide film removing, and after that epitaxial growth is carried out (step 414). In this case, while sizes of oxide precipitates immediately after the epi step are not so large as to have an enough IG capability, the oxide precipitates grow to sizes each having an IG capability by heat treatment in a device fabrication process into which the wafer is loaded after the epi step; an excellent IG capability is imparted to the wafer.

The above heat treatment according to the present invention may be applied to a wafer to be heat-treated before or after mirror polishing (may be referred to as mechanical chemical polishing). In the case where the heat treatment is performed before the mirror polishing, the mirror polishing is applied after the heat treatment and then epitaxial growth follows.

In order to sufficiently achieve the effect of the heat-treating method of the present invention, oxygen concentration of a silicon wafer to be heat-treated is desirably about 16 ppma or higher. When the oxygen concentration is higher, the density of precipitates is raised; it is possible to impart a more excellent IG capability to a wafer. Furthermore, the higher the oxygen concentration is, the faster the growth rate of the precipitates becomes, so a total process time is shortened.

Figure 9:
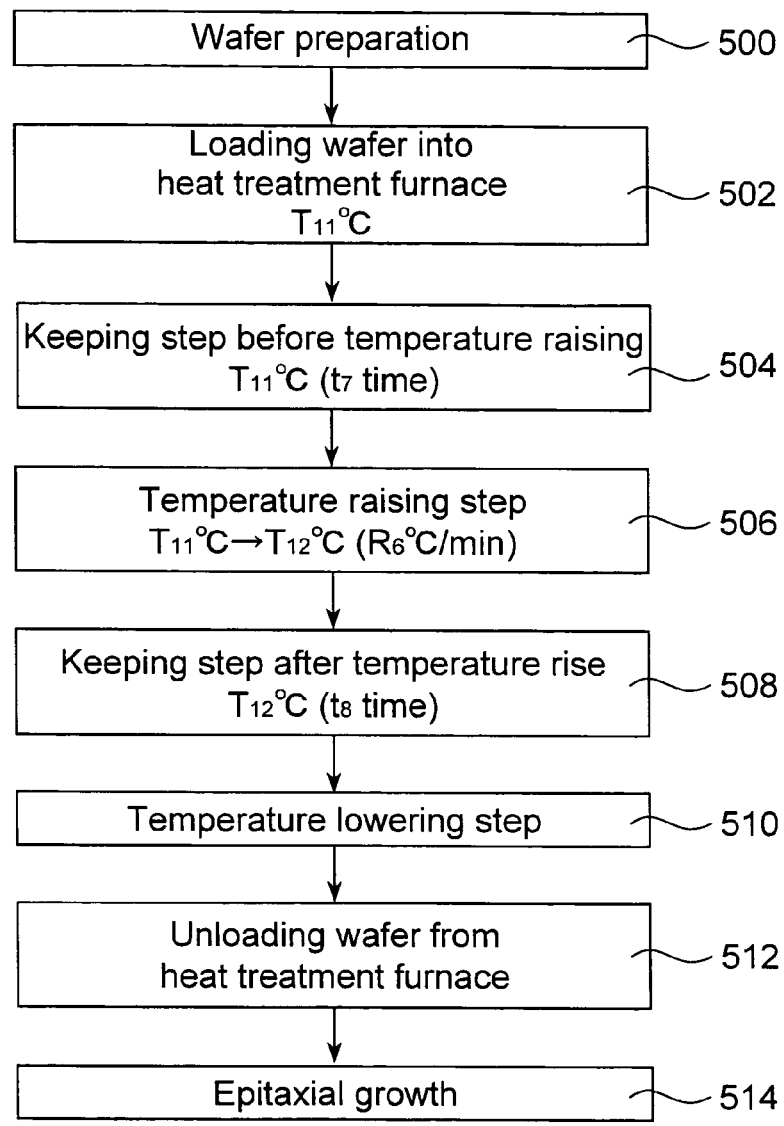
FIG. 9 is a flow chart showing an example of step orders of a second aspect of a method for manufacturing a silicon epitaxial wafer of the present invention.
Figure 10:
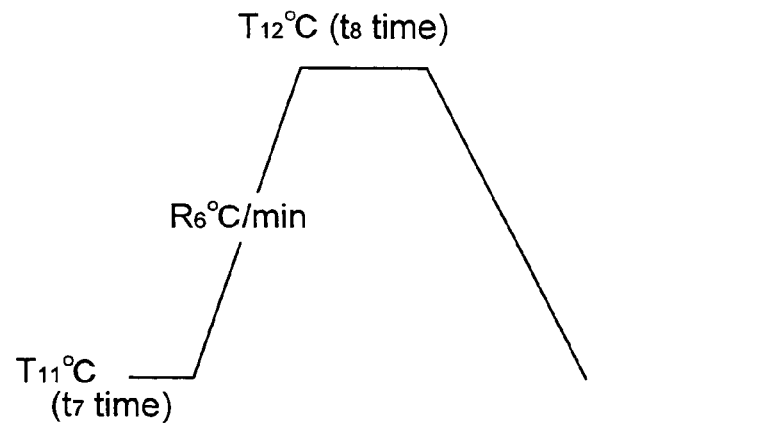
FIG. 10 is a descriptive schematic view showing essential parts of the step order of FIG. 9.

FIG. 9 is a flow chart showing an example of step orders of a second aspect of a method for manufacturing a silicon epitaxial wafer of the present invention and FIG. 10 is a descriptive schematic view showing essential parts of the step order of FIG. 9.

As shown in FIG. 9, at first there is prepared a wafer having grown-in precipitation nuclei to be heat-treated (step 500). This wafer can be obtained by processing a silicon single crystal grown by means of an ordinary CZ method. The wafer is loaded into a heat treatment furnace (step 502).

The heat treatment furnace is maintained at $T_{11}°$ C. (500° C. to 700° C.) and the loaded wafer is kept at the $T_{11}°$ C. for a prescribed time ($t_7$ time), preferably 15 min or longer, prior to performing the next temperature raising step (a keeping step before temperature raising: step 504). Then, as well shown in FIG. 10, a temperature in the heat treatment furnace is raised from the $T_{11}°$ C. to $T_{12}°$ C. set in the range of from 1000° C. to 1100° C. at a temperature raising rate $R_6°$ C./min of 5° C./min or less (a temperature raising step: step 506). In the temperature raising step (step 506), grown-in precipitation nuclei of high density can be efficiently grown without annihilation.

If there is a desire for changing the density of oxide precipitates to a level of contamination in a device fabrication process, the density can be easily changed, for example, by setting the $T_{12}°$ C. to about 1000° C. and the temperature raising rate $R_6°$ C./min to about 3° C./min, and changing the $T_{11}°$ C.

Then, the wafer is kept at the $T_{12}°$ C. for a prescribed time ($t_8$ time) (a keeping step after temperature raising: step 508). Here, the keeping time is preferably about 30 min or longer. In the keeping step after temperature raising (step 508), minute oxide precipitates grown-in the previous temperature raising step (step 506) can be grown into oxide precipitates of desired sizes each of the order of from 30 nm to 40 nm in diameter, preferably of 50 nm or larger. Thus, it is an object of the keeping step after temperature raising (step 508) at the $T_{12}°$ C. to further grow oxide precipitates grown-in the temperature raising step (step 506). Therefore, as far as the object can be achieved, this step is not limited to keeping a constant temperature but can be modified to a step accompanied with some temperature changes (raising or lowering temperatures or the like).

Furthermore, by changing the $T_{12}°$ C. and the keeping time $t_8$ in the keeping step after temperature raising (step 508), sizes of oxide precipitates can be easily changed.

Note that the wafer to be heat-treated is irrespective of the presence or absence of addition of impurities and concentration of impurities. For example, even a nitrogen-doped wafer can achieve an almost similar effect to a nitrogen un-doped wafer.

After the above heat treatment, for example, a temperature in the heat treatment furnace is lowered from the $T_{12}°$ C. to 700° C. at a rate of 2° C./min (a temperature lowering step: step 510), and after that the wafer is unloaded from the heat treatment furnace (step 512). Note that no specific limitation is put on the temperature lowering rate and the lowest temperature after the temperature has been lowered.

Then, if required, there are performed such processes as wafer cleaning and oxide film removing, and after that epitaxial growth is carried out (step 514). In this case, no re-dissolution of oxide precipitates occurs during the epitaxial growth step; there can be obtained a silicon epitaxial wafer in which oxide precipitates of sizes each having an IG capability are generated before being loaded into a device fabrication process.

The heat treatment may be applied to a wafer to be heat-treated before or after mirror polishing (may be referred to as mechanical chemical polishing). In the case where the heat treatment is performed before the mirror polishing, the mirror polishing is applied after the heat treatment and then epitaxial growth follows.

In order to sufficiently achieve the effect of the heat-treating method of the present invention, oxygen concentration of a silicon wafer to be heat-treated is desirably about 16 ppma or higher. When the oxygen concentration is higher, the density of precipitates is raised; it is possible to impart a more excellent IG capability to a wafer. Furthermore, the higher the oxygen concentration is, the faster the growth rate of the precipitates becomes, so a total process time is shortened.

EXAMPLES

While description will be given of the present invention showing Experimental Examples below, the present invention is not limited to the Experimental Examples.

Experimental Examples 1 to 5

There were prepared boron-doped silicon wafers each having a diameter of 8 inches, a plane orientation of <100> and resistivity of about 10 Ω·cm grown by means of a CZ method. Oxygen concentrations of the wafers were 16.0, 17.0, 18.5 and 19.5 ppma, respectively (JEIDA scale). The wafers were all subjected to heat treatment at 1050° C. for 1 hr. With the aid of the heat treatment, almost all oxygen precipitation nuclei formed in a crystal thermal history are annihilated. By this treatment, for example, there can be simulated states of an epi wafer containing almost no oxygen precipitation nuclei and a wafer heat-treated at a temperature of 1000° C. or higher in advance. Note that JEIDA is an abbreviation for Japan Electronic Industry Development Association (now renamed JEITA: Japan Electronics and Information Technology Industries Association).

Next, heat treatment shown in FIGS. 1 and 2 was applied to the wafers. That is, a temperature was raised from $T_1°$ C. to $T_2°$ C. at a rate of $R_1°$ C./min, from the $T_2°$ C. to $T_3°$ C. at a rate of $R_2°$ C./min and kept at the $T_3°$ C. for t time. After the keeping, a temperature in a heat treatment furnace was lowered to 800° C. at a rate of 2° C./min and then the wafer was unloaded from the heat treatment furnace.

The density of oxide precipitates in the bulk of the heat-treated wafer was measured with an infrared scattering tomography method (hereinafter may be referred to LST), which is one of infrared scattering methods. Note that, while Experimental Examples 1 to 5 include ones carried out in the same heat treatment condition, they are performed as independent experiments using separate wafers; there are some differences among measured values of the density of oxide precipitates, the differences being inessential.

Figure 11:
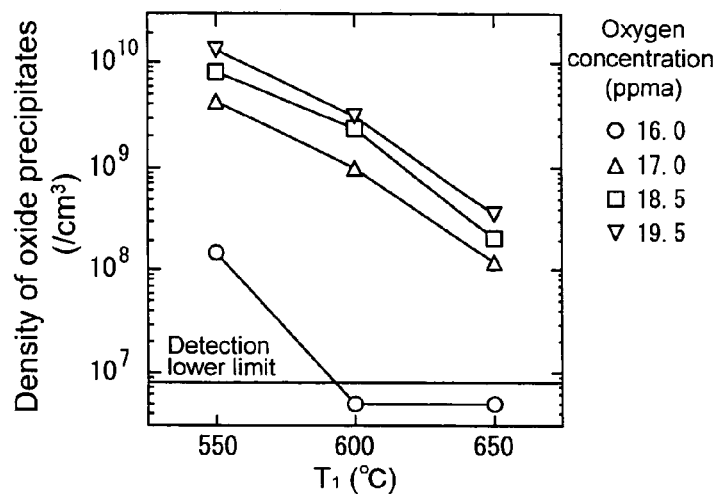
FIG. 11 is a graph showing a relationship between $T_1$ and density of oxide precipitates in Experimental Example 1.

FIG. 11 shows the density of oxide precipitates at 550° C., 600° C. and 650° C. of the $T_1°$ C. (Experimental Example 1). In this case, the other conditions were as follows: $T_2$=750° C., $R_1$=1° C./min, $T_3$=1050° C., $R_2$=3° C./min and t=2 hrs. The lower the $T_1°$ C. is, the higher the density of oxide precipitates becomes. This is because the lower the temperature is, the faster the precipitation nucleus forming rate becomes and the longer the temperature raising time becomes, thereby a time for generating precipitation nuclei being longer. Furthermore, the higher the oxygen concentration is, the higher the density of oxide precipitates becomes. This is because the higher the oxygen concentration is, the faster the precipitation nucleus forming rate becomes. In order to obtain an IG capability, the density of oxide precipitates is desirably on the order of $10^8/cm^3$ or higher. This indicates that the $T_1°$ C. is preferably about 650° C. or lower. Further, it is found that the oxygen concentration is preferably about 17 ppma or higher in order to attain oxide precipitates of high density. Furthermore, as shown in FIG. 11, by changing the $T_1°$ C., the density of oxide precipitates can be easily changed. This is effective where there is a desire for obtaining requested density of oxide precipitates to a level of contamination in a device fabrication process.

Figure 12:
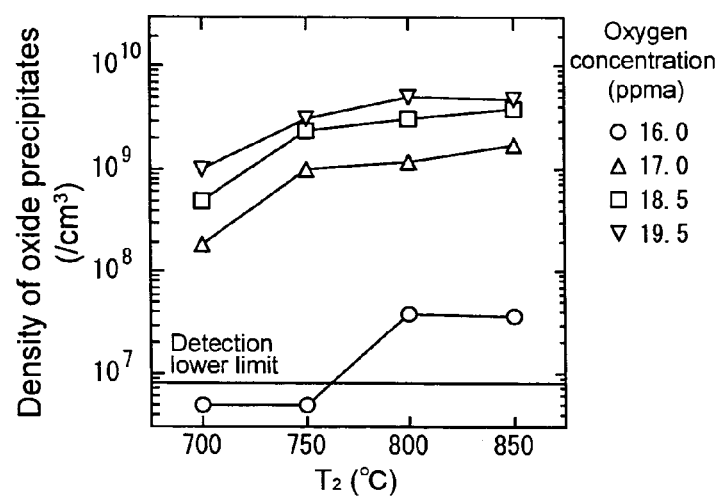
FIG. 12 is a graph showing a relationship between $T_2$ and density of oxide precipitates in Experimental Example 2.

FIG. 12 shows the density of oxide precipitates at 700° C., 750° C., 800° C. and 850° C. of the $T_2$° C. (Experimental Example 2). In this case, the other conditions were as follows: $T_1$=600° C., $R_1$=1° C./min, $T_3$=1050° C., $R_2$=3° C./min and t=2 hrs. When the oxygen concentration is about 17 ppma or higher, the density of oxide precipitates shows almost no change at the $T_2$° C. of 750° C. or higher. This is because since formation of precipitation nuclei is hard to progress in a temperature raising step at a temperature of 750° C. or higher, the density of oxygen precipitation nucleus is almost unchanged. The fact that the density of oxide precipitates is low at 700° C. is because the density of oxygen precipitation nuclei formed is low due to a short time of the temperature raising step A. This indicates that the density of oxide precipitates can be higher by setting the $T_2$° C. to about 700° C. or higher, preferably about 750° C. or higher.

Figure 13:
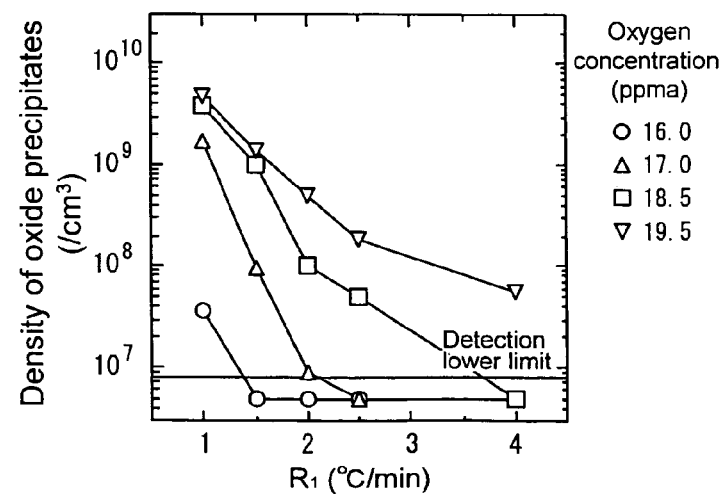
FIG. 13 is a graph showing a relationship between $R_2$ and density of oxide precipitates in Experimental Example 3.

FIG. 13 shows the density of oxide precipitates 1° C./min, 1.5° C./min, 2° C./min, 2.5° C./min and 4° C./min of the $R_1$° C./min (Experimental Example 3). In this case, the other conditions were as follows: $T_1$=600° C., $T_2$=750° C., $T_3$=1050° C., $R_2$=3° C./min and t=2 hrs. The lower the $R_1$° C./min is, the higher the density of oxide precipitates becomes. This is because the lower the rate is, the longer the time for generating precipitation nuclei becomes. From FIG. 13, it is found that the $R_1$° C./min is preferably about 1.5° C./min or less in order to attain oxide precipitates of high density.

Figure 14:
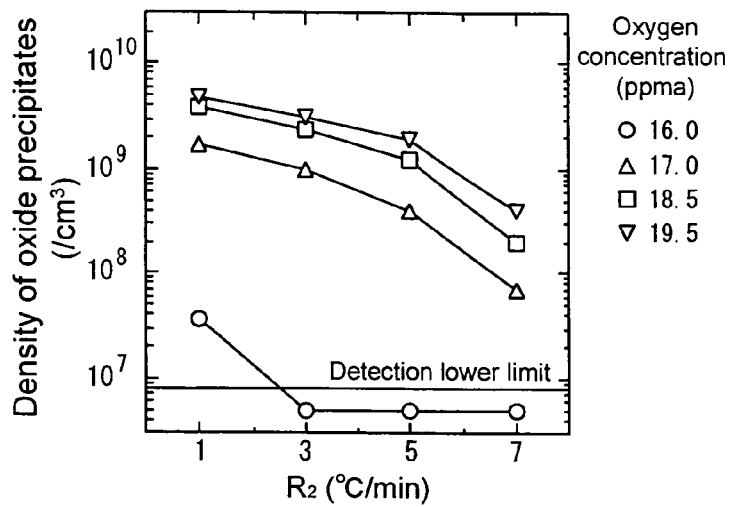
FIG. 14 is a graph showing a relationship between $R_2$ and density of oxide precipitates in Experimental Example 4.

FIG. 14 shows the density of oxide precipitates at 1° C./min, 3° C./min, 5° C./min, and 7° C./min of the $R_2$° C./min (Experimental Example 4). In this case, the other conditions were as follows: $T_1$=600° C., $T_2$=750° C., $R_{1=1}$° C./min, $T_3$=1050° C., and t=2 hrs. The slower the $R_2$° C./min is, the higher the density of oxide precipitates becomes. This is because at a slower rate, more of oxygen precipitation nuclei formed in the previous stage can grow into oxide precipitates without annihilation. To the contrary, when the rate is faster, the proportion of oxygen precipitation nuclei to be annihilated becomes higher; the density of oxide precipitates is reduced. From FIG. 14, it is found that the $R_2$° C./min is about 7° C./min or less, preferably about 5° C./min or less in order to attain oxygen precipitates of high density.

Figure 15:
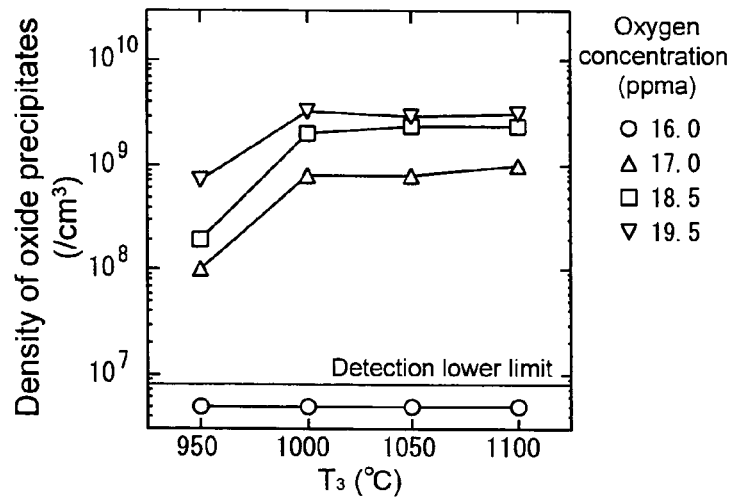
FIG. 15 is a graph showing a relationship between $T_3$ and density of. oxide precipitates in Experimental Example 5.

FIG. 15 shows the density of oxide precipitates at 950° C., 1000° C., 1050° C. and 1100° C. of the $T_3$° C. (Experimental Example 5). In this case, the other conditions were as follows: $T_1$=600° C., $T_2$=750° C., $R_1$=1° C./min, $R_2$=3° C./min and t=1 hr. At the $T_3$ of 1000° C. or higher, the density of oxide precipitates is almost unchanged. This is because at 1000° C. or higher, oxide precipitates have been sufficiently grown to detectable sizes. The fact that the density of oxide precipitates is low at 950° C. is because at the keeping time of 1 hr, the proportion of oxide precipitates not to grow up to detectable sizes is high. In this case, if the keeping time is longer, the density of detectable oxide precipitates becomes to the same level in case of 1000° C. or higher, but a longer process time is required. This indicates that the $T_3$° C. is preferably about 1000° C. or higher.

As can be seen from the above description, by setting the $T_1$ to about 650° C. or lower, the $T_2$° C. to about 700° C. or higher, the $R_1$° C./min to about 1.5° C./min or less, the $R_2$° C./min to about 7° C./min or less, the $T_3$° C. to about 1000° C. or higher and the t time to about 1 hr or longer, respectively, oxide precipitates of large sizes can be efficiently generated even in a wafer containing almost no oxygen precipitation nuclei. That is, there can be stably provided a wafer having an excellent IG capability at a stage prior to a device fabrication process. Further, even in wafers having fluctuations in density of oxygen precipitation nuclei due to different crystal thermal histories, by performing the heat treatment in the method for manufacturing a silicon wafer of the present invention after the heat treatment has been carried out for annihilating the oxygen precipitation nuclei thereof as in these Experimental Examples, fluctuations in the IG capabilities thereof can be reduced.

Experimental Examples 6 to 10

There were prepared mirror-polished silicon wafers each having a diameter of 8 inches, a plane orientation of <100> and resistivity of about 10 Ω·cm, which were manufactured from different two portions (these portions belong to positions grown-in the former half and the latter half of the crystal growth step and hereinafter may be referred to as a crystal position A and a crystal position B, respectively) of a boron-doped silicon single crystal grown by means of a CZ method. Oxygen concentrations of the wafers are 16 ppma to 20 ppma (JEIDA scale).

Next, the wafers were subjected to heat treatment in atmosphere of a mixture of oxygen and nitrogen according to a procedure shown in FIGS. 3 and 4. That is, the wafer was kept at $T_4$° C. for $t_1$ time, thereafter the temperature was raised from the $T_4$° C. to $T_5$° C. at a rate of R° C./min and kept at the $T_5$° C. for $t_2$ time. After the keeping, the temperature in a heat treatment furnace was lowered to 700° C. at a rate of 2° C./min and then the wafers were unloaded from the heat treatment furnace. The density of oxide precipitates in the bulk of the wafer was measured with the LST without any heat treatment. According to the LST, there are detectable oxide precipitates having sizes of about 40 nm or larger in diameter.

Figure 16:
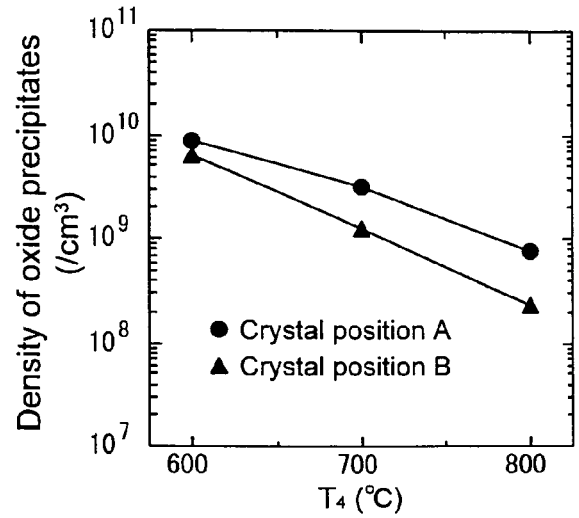
FIG. 16 is a graph showing a relationship between $T_4$ and density of oxide precipitates in Experimental Example 6.

FIG. 16 shows the density of precipitates at 600° C., 700° C., and 800° C. of the $T_4$° C. (Experimental Example 6). In this case, the other conditions were as follows: $t_1$=30 min, R=3° C./min, $T_5$° C.=1050° C. and $t_2$=2hrs. Oxygen concentrations are 16 ppma to 18 ppma. The lower the $T_4$° C. is, the higher the density of precipitates becomes. This is because there is increased the density of grown-in precipitation nuclei which grow at a lower temperature without annihilation. In order to obtain an excellent IG capability, the density of precipitate is desirably on the order of $10^9$/cm$^3$ or higher. This indicates that the $T_4$° C. is about 700° C. or lower. Moreover, as shown in FIG. 16, by changing the $T_4$° C., the density of precipitates can be easily changed. This is effective where there is a desire for obtaining requested density of precipitates to a level of contamination in a device fabrication process.

Figure 17:
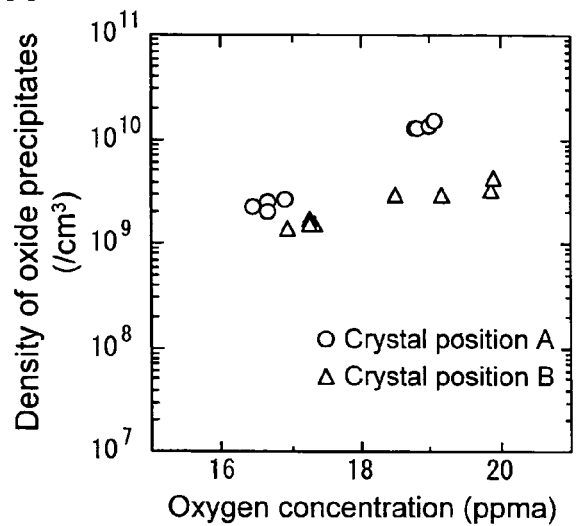
FIG. 17 is a graph showing a relationship between oxygen concentration and density of oxide precipitates in Experimental Example 7.

FIG. 17 shows the oxygen concentration dependence of density of precipitates at $T_4$=700° C., $t_1$=30 min, R=3° C./min, $T_5$=1050° C. and $t_2$=2 hrs (Experimental Example 7). This result indicates that in either crystal position there is a trend that as the oxygen concentration increases, the density of oxide precipitates increases. It is also found that when an oxygen concentration is about 16 ppma or higher, the high density of precipitates of the order of $10^9$/cm$^3$ or higher can be surely achieved. This is because the higher the oxygen concentration is, the higher the density of grown-in precipitation nuclei becomes and the larger the sizes of oxide precipitates becomes, thereby the detectable proportion thereof being increased.

Figure 18:
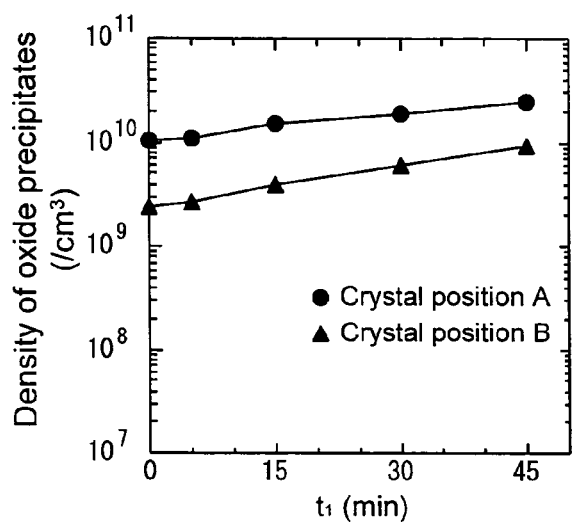
FIG. 18 is a graph showing a relationship between a keeping time $t_1$ and density of oxide precipitates in Experimental Example 8.

FIG. 18 shows the density of precipitates at 0 min, 5 min, 15 min, 30 min and 45 min of the $t_1$ time (Experimental Example 8). In this case, the other conditions were as follows: $T_4$=700° C., R=3° C./min, $T_5$=1050° C. and $t_2$=2 hrs. Oxygen concentrations are 18 ppma to 20 ppma. When the $t_1$ time is about 15 min or longer, the density of precipitates increases with time. This is because as the $t_1$ time is longer, the proportion of grown-in precipitation nuclei to be grown without annihilation becomes higher and new precipitation nuclei are generated for the keeping of the $t_1$ time. This result indicates that even in the case where the $t_1$ time is shorter than 15 min, the high density of precipitates can be achieved, but in the case where the $t_1$ time is 15 min or longer, the density of precipitates is further increased; it is found that the latter case is more preferable.

Figure 19:
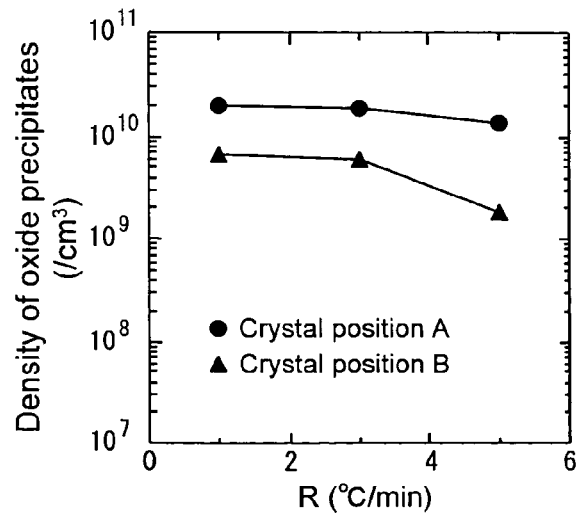
FIG. 19 is a graph showing a relationship between a temperature raising rate R and density of oxide precipitates in Experimental Example 9.

FIG. 19 shows the density of precipitates at 1° C./min, 3° C./min and 5° C./min of the R° C./min (Experimental Example 9). In this case, the other conditions were as follows: $T_4$=700° C., ti =30 min, $T_5$=1050° C. and $t_2$=2 hrs. Oxygen concentrations are 18 ppma to 20 ppma. The slower the R° C./min is, the higher the density of precipitates becomes. The reason why when the R° C./min is faster, the density of precipitates becomes lower is that there becomes higher the proportion of precipitation nuclei which are annihilated without growth in the temperature raising step. This result indicates that in order to achieve the high density of precipitates of the order of $10^9/cm^3$ or higher, the R° C./min is preferably about 5° C./min or less, more preferably about 3° C./min or less.

Figure 20:
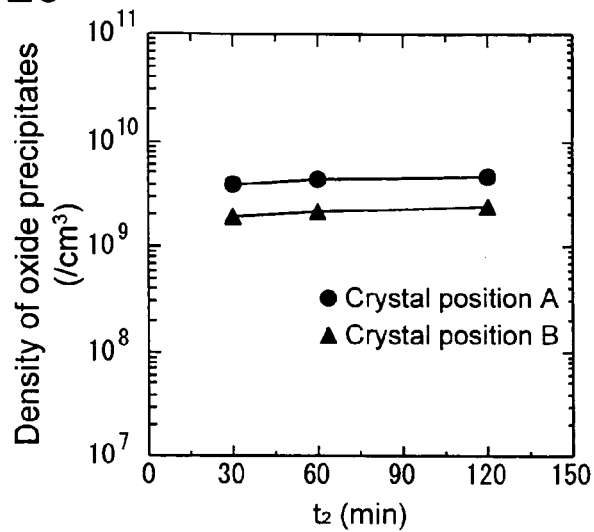
FIG. 20 is a graph showing a relationship between a keeping time $t_2$ and density of oxide precipitates in Experimental Example 10.

FIG. 20 shows the density of oxide precipitates at 30 min, 60 min and 120 min of the $t_2$ time (Experimental Example 10). In this case, the other conditions were as follows: $T_4$=700° C., $t_5$=30 min, R=3° C./min, $T_5$=1100° C. Oxygen concentrations are 18 ppma to 20 ppma. The density of precipitates is high almost independently of the $t_2$ time. This result indicates that when the $t_2$ time is about 30 min or longer, the high density of precipitates is surely achieved.

Experimental Example 11

Mirror-polished wafers similar to the wafers used in Experimental Examples 6 to 10 were prepared. Then, according to a heat treatment procedure shown in FIGS. 3 and 4, the following conditions were applied: $T_4$=700° C., $t_1$=30 min, R=3° C./min and $t_2$=2 hrs, and there were performed 4 levels of heat treatment where the $T_5$° C. was changed to 950° C., 1000° C., 1050° C. and 1100° C., respectively. After the keeping at the $T_5$° C., the temperature in a heat treatment furnace was lowered to 700° C. at 2° C./min and then the wafers were unloaded from the heat treatment furnace. The density of oxide precipitates in the bulk of the wafer was measured with the LST without any heat treatment.

Figure 21:
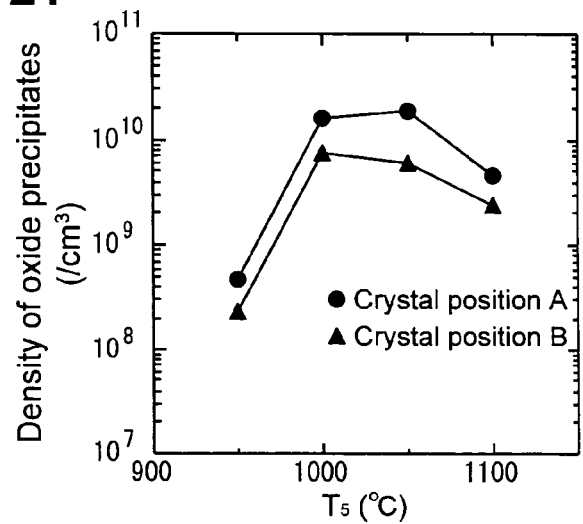
FIG. 21 is a graph showing a relationship between $T_5$ and density of oxide precipitates in Experimental Example 11.

FIG. 21 shows a relationship between density of precipitates and $T_5$° C. in the Experimental Example. Oxygen concentrations are 18 ppma to 20 ppma. When the $T_5$° C. is 1000° C. or higher, the density of precipitates becomes high. The reason why the density of oxide precipitates decreases at 950° C. is that a growth rate of the precipitates is slower than at 1000° C. or higher and hence sizes of precipitates are too small to be detectable by the LST. This result indicates that in order to generate precipitates of large sizes at high density at a stage prior to a device fabrication process, the $T_5$° C. is preferably about 1000° C. or higher.

Experimental Example 12

Mirror-polished wafers similar to the wafers used in Experimental Examples 6 to 11 were prepared. Then, according to a heat treatment procedure shown in FIGS. 3 and 4, the following conditions were applied: $T_4$=700° C., $t_1$=30 min, R=3° C./min and $t_2$=2 hrs, and there were performed 3 levels of heat treatment where the $T_5$° C. was changed to 1000° C., 1050° C. and 1100° C., respectively. After the keeping at the $T_5$° C., the temperature in a heat treatment furnace was lowered to 700° C. at 2° C./min and then the wafers were unloaded from the heat treatment furnace.

The heat-treated wafers were cleaved and then subjected to chemical preferential etching. Thereafter, by observing a cleaved surface thereof through an optical microscope, there was measured a depth from a wafer surface of the region where no etch pits due to oxide precipitates were observed (hereinafter may be referred to as a DZ width).

Figure 22:
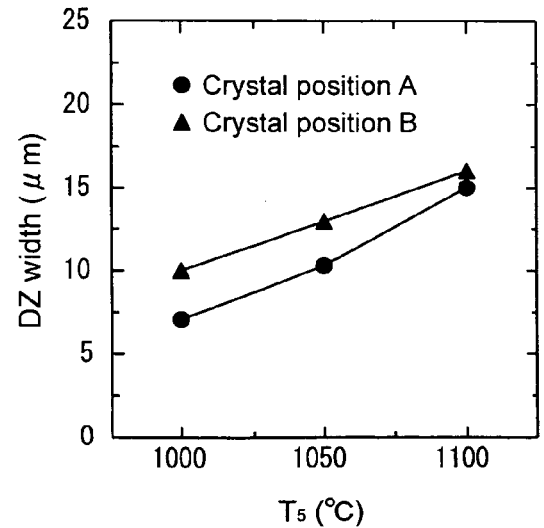
FIG. 22 is a graph showing a relationship between $T_5$ and a DZ width in Experimental Example 12.

A relationship between a DZ width obtained in the above measurement and the $T_5$° C. is shown in FIG. 22. Oxygen concentrations are 18 ppma to 20 ppma. The higher the $T_5$° C. is, the wider the DZ width becomes. This is because the higher the temperature is, the faster the diffusion rate of oxygen becomes; oxygen in the vicinity of a wafer surface is out-diffused, so that oxygen precipitation nuclei in the vicinity of the wafer surface are annihilated.

As described above, by setting the $T_4$° C. to about 700° C. or lower, the R° C./min to about 5° C./min or less, the $T_5$° C. to about 1000° C. or higher and the $t_2$ time to about 30 min or longer, respectively, a silicon wafer having a defect-free layer (DZ layer) in the vicinity of a surface thereof and oxide precipitates each having a high gettering capability in the bulk thereof can be attained with the aid of an extremely efficient and simple heat treatment.

Experimental Example 13

There were prepared boron-doped silicon wafers each having a diameter of 8 inches, a plane orientation <100> and resistivity of about 10 Ω·cm grown by means of a CZ method. Each of these wafers is one having a few defects with few COPs and voids which is manufactured from a silicon single crystal pulled in a condition that suppresses generation of void defects in growth thereof. Oxygen concentrations of the wafers were 14.5, 15.4 and 17.0 ppma, respectively (JEIDA scale).

Next, the wafers were subjected to heat treatment in atmosphere of a mixture of oxygen and nitrogen according to a procedure shown in FIGS. 3 and 4. That is, the wafer was kept at 700° C. for 1 hr, then the temperature was raised up to 1150° C. at a rate of 3° C./min and kept at 1150° C. for 4 hrs. After the keeping, the temperature in a heat treatment furnace was lowered to 700° C. at a rate of 3° C./min and then the wafers were unloaded from the heat treatment furnace. There was measured a depthwise distribution of density of oxide precipitates from a position in the vicinity of a surface of each wafer to another position in the bulk thereof with the LST without any heat treatment.

Figure 23:
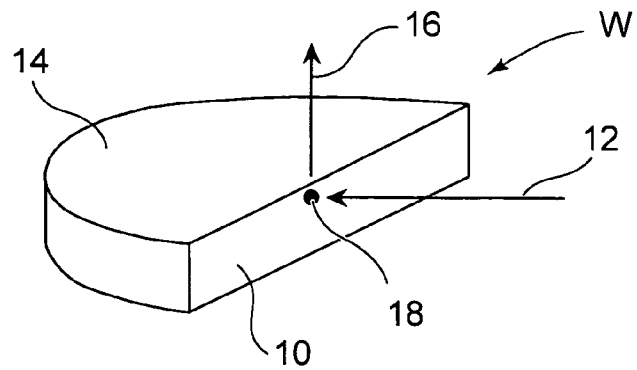
FIG. 23 is a descriptive view showing a measuring arrangement in an infrared scattering tomography.

There is shown a measuring arrangement with the LST in measurement of a depthwise distribution of density of oxide precipitates in FIG. 23. An infrared beam 12 is incident upon a cleaved surface 10 of a cleaved wafer W and there is detected scattering light 16 from precipitates coming out of a wafer surface 14. In this measurement, by changing a distance from the surface of the incident point 18 (a depth from the surface) at the intervals of 5 μm in the range of 5 μm to 35 μm, the depthwise distribution of density of precipitates was measured. The depth resolution in this case is on the order of ±5 μm. Accordingly, for example, the density of precipitates at a point of 10 μm in depth actually shows an average value thereof in a region of the order of 5 μm to 15 μm in depth.

Figure 24:
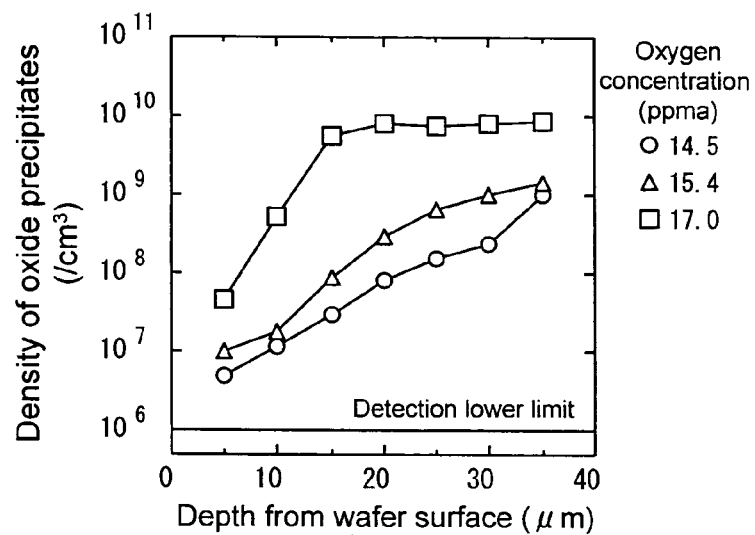
FIG. 24 is a graph showing a distribution of density of oxide precipitates in a wafer depth direction in Experimental Example 13.

FIG. 24 shows results of measurement of the depthwise distribution of density of precipitates. In this case, the density of precipitates at the positions of 5 μm in depth in the wafers having any oxygen concentrations was on the order of $10^6/cm^3$ to $10^7/cm^3$. These results indicate that a region on the order of 0 μm to 10 μm deep is effective as a DZ layer, but precipitates of low density still remain therein.

Further, there was separately prepared a wafer similar to the above wafers except for the oxygen concentration of 18 ppma. The wafer was subjected to heat treatment where the wafer was kept at 700° C. for 1 hr, then the temperature was raised to 1200° C. at a rate of 3° C./min and kept at 1200° C. for 1 hr.

Furthermore, the density of oxide precipitates of the heat-treated wafer was observed, and the results indicate that in a region of about 10 μm deep from a wafer surface, there was formed a DZ layer where precipitates remain at low density of the order of $10^7/cm^3$ or lower, and in the bulk portion deeper than the layer, the density of oxide precipitates of about $5 \times 10^9/cm^3$ were obtained.

Experimental Example 14

There were prepared wafers similar to the wafers used in Experimental Example 13. Then, the wafers were subjected to heat treatment in atmosphere of a mixture of oxygen and nitrogen according to a procedure shown in FIGS. 5 and 6. That is, the wafer was kept at 700° C. for 1 hr, then the temperature was raised to 900° C. at a rate of 3° C./min, further raised from 900° C. to 1150° C. at a rate of 5° C./min and kept at 1150° C. for 4 hrs. After the keeping, the temperature in a heat treatment furnace was lowered to 700° C. at a rate of 3° C./min and the wafers were unloaded from the heat treatment furnace. That is, unlike in Experimental Example 13 (the second embodiment of the present invention), there was carried out such heat treatment as the temperature raising rate was faster from the middle of the temperature raising step (which corresponds to the third embodiment of the present invention). There was measured a depthwise distribution of density of precipitates of each wafer without any heat treatment according to the method similar to Experimental Example 13 with the LST.

Figure 25:
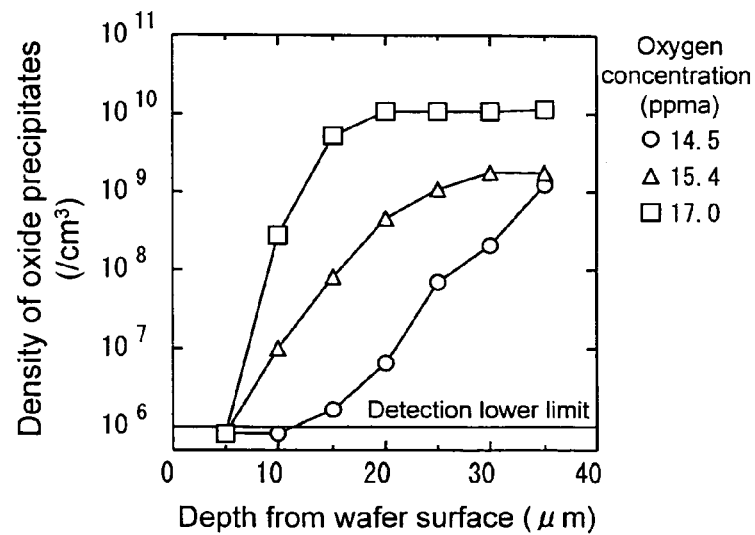
FIG. 25 is a graph showing a distribution of density of oxide precipitates in a wafer depth direction in Experimental Example 14.

FIG. 25 shows results of measurement of a depthwise distribution of a density of precipitates. In a wafer having any oxygen concentrations, the density of precipitates at the position 5 μm deep was the detection lower limit (about $1 \times 10^6/cm^3$) or less. This results indicate that there exists no detectable precipitates in the region of the order of 0 μm to 10 μm deep. That is, it is found that there is formed a DZ layer of an extremely high quality. Further, it is found that when the oxygen concentration is low, the DZ layer is wider. This is because the lower the oxygen concentration prior to the heat treatment, the lower the oxygen concentration in a surface region in the vicinity of a surface of the heat-treated wafer, thereby precipitates in the vicinity of the surface thereof being easily annihilated. On the other hand, it is found that the density of precipitates in the interior of the wafer is $1 \times 10^9/cm^3$ or higher; an excellent IG capability can be expected.

Furthermore, there was separately prepared a wafer similar to the wafers used in Experimental Example 13 except for the oxygen concentration of 16 ppma. The wafer was subjected to heat treatment where the wafer was kept at 700° C. for 1 hr, then the temperature was raised to 900° C. at a rate of 3° C./min, further raised from 900° C. to 1200° C. at a rate of 5° C./min and kept at 1200° C. for 1 hr.

Then, the density of oxide precipitates of the heat-treated wafer was observed, and the results indicate that in a region of about 10 μm deep from a wafer surface, there was formed a DZ layer having density of oxide precipitates of $1 \times 10^6/cm^3$ or lower, and in the bulk portion deeper than the layer, the density of oxide precipitates of about $3 \times 10^9/cm^3$ were obtained.

As described above, according to the third aspect of the method for manufacturing a silicon wafer of the present invention, there can be formed a high quality DZ-IG structure which combines a DZ layer containing few precipitates and an IG layer having an excellent IG capability.

Experimental Examples 15 to 20

There were prepared silicon wafers each having a diameter of 8 inches, a plane orientation of <100> and resistivity of about 10 Ω·cm, which were sliced from different two portions (these portions belong to positions grown-in the former half and the latter half of the crystal growth step and hereinafter may be referred to as a crystal position A and crystal position B, respectively) of a boron-doped silicon single crystal grown by means of a CZ method. The wafers prepared here were chemical etched wafers that are not subjected to mirror polishing. Oxygen concentrations of the wafers are 16 ppma to 20 ppma (JEIDA scale).

Then, the wafers were subjected to heat treatment according to the procedure shown in FIGS. 7 and 8. That is, the wafer was kept at $T_9°$ C. for $t_5$ time, thereafter the temperature was raised from the $T_9°$ C. to $T_{10}°$ C. at a rate of $R_5°$ C./min and kept at the $T_{10}°$ C. for $t_6$ time. After the keeping, the temperature in a heat treatment furnace was lowered to 700° C. at a rate of 2° C./min and then the wafers were unloaded from the heat treatment furnace.

After the heat-treated wafers were mirror-polished, a silicon single crystal layer about 3 μm thick was deposited on each of the mirror-polished wafers by epitaxial growth at about 1100° C. to thereby obtain epi wafers.

After the epi wafers were subjected to heat treatment at 1000° C. for 2 hrs that simulates a device fabrication process with a low temperature and a short time, the density of oxide precipitates in the bulk of the wafer below the epitaxial layer of each epi wafer was measured with the LST. With the LST, there are detectable oxide precipitates having sizes of about 40 nm or larger in diameter.

Figure 26:
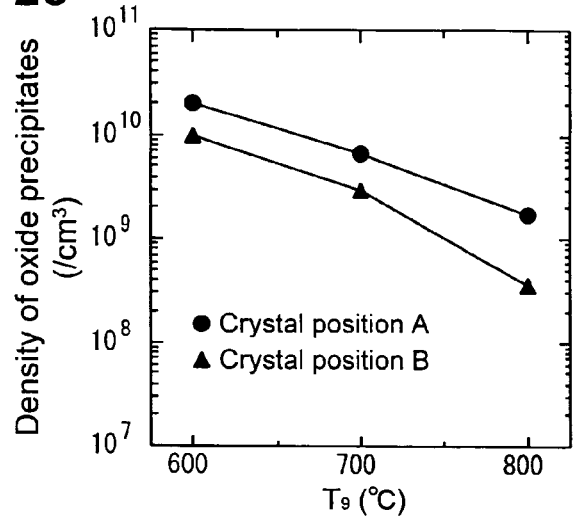
FIG. 26 is a graph showing a relationship between $T_9$ and density of oxide precipitates in Experimental Example 15.

FIG. 26 shows the density of precipitate at values 600° C., 700° C., and 800° C. of the $T_9°$ C. (Experimental Example 15). In this case, the other conditions were as follows: $t_5$=30 min, $R_5$=3° C./min, $T_{10}°$ C.=850° C. and $t_6$=1 hr. Oxygen concentrations are in the range of from 16 ppma to 18 ppma. The lower the $T_9°$ C. is, the higher the density of precipitates becomes. This is because there is increased the density of grown-in precipitation nuclei which grow at a lower temperature without annihilation. In order to obtain an excellent IG capability, the density of precipitates is desirably on the order of $10^9/cm^3$ or higher. This indicates that the $T_9°$ C. is preferably about 700° C. or lower. Moreover, as shown in FIG. 26, by changing the $T_9°$ C., the density of precipitates can be easily changed. This is effective where there is a desire for obtaining requested density of precipitates to a level of contamination in a device fabrication process.

Figure 27:
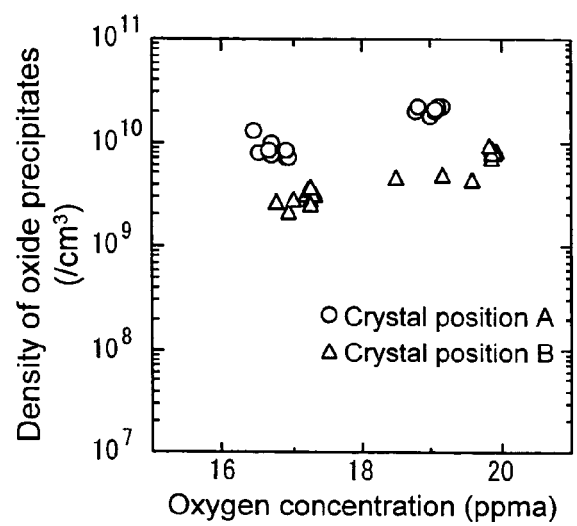
FIG. 27 is a graph showing a relationship between oxygen concentration and density of oxide precipitates in Experimental Example 16.

FIG. 27 shows the oxygen concentration dependence of density of precipitates at $T_9$=700° C., $t_5$=30 min, $R_5$=° C./min, $T_{10}$=850° C. and $t_6$ =1 hr (Experimental Example 16). This result indicates that in either crystal positions there is a trend that as the oxygen concentration increases, the density of oxide precipitates increases. It is also found that when the oxygen concentration is about 16 ppma or higher, the high density of precipitates of the order of $10^9/cm^3$ or higher can be surely achieved. This is because the higher the oxygen concentration is, the higher the density of grown-in precipitation nuclei becomes and the larger the sizes of oxide precipitates becomes, thereby a proportion of the detectable precipitates being increased after the heat treatment at 1000° C. for 2 hrs.

Figure 28:
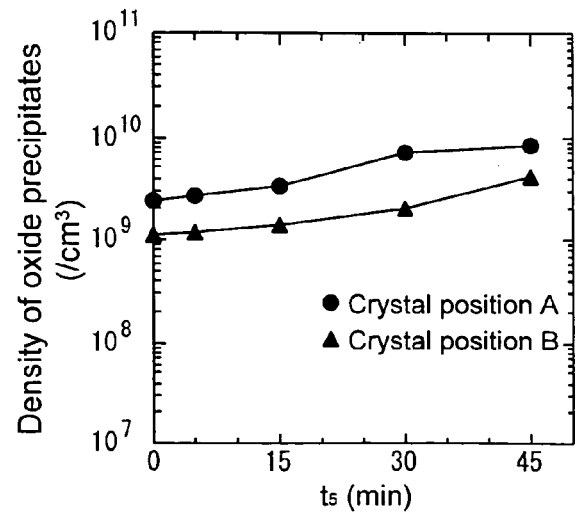
FIG. 28 is a graph showing a relationship between a keeping time $t_5$ and density of oxide precipitates in Experimental Example 17.

FIG. 28 shows the density of precipitates at 0 min, 5 min, 15 min, 30 min and 45 min of the $t_5$ time (Experimental Example 17). In this case, the other conditions were as follows: $T_9$=700° C., $R_5$=3° C./min, $T_{10}$° C.=850° C. and $t_6$=1 hr. Oxygen concentrations are 16 ppma to 18 ppma. When the $t_5$ time is 15 min or longer, there is a trend that the density of precipitates increases with time. This is because as the $t_5$ time is longer, the proportion of grown-in precipitation nuclei to be grown without annihilation becomes higher and new precipitation nuclei are generated during the keeping of the $t_5$ time. This result indicates that even in the case where the $t_5$ time is shorter than 15 min, the high density of precipitates can be achieved, but in the case where the $t_5$ time is 15 min or longer, the density of precipitates is further increased; it is found that the latter case is more preferable.

Figure 29:
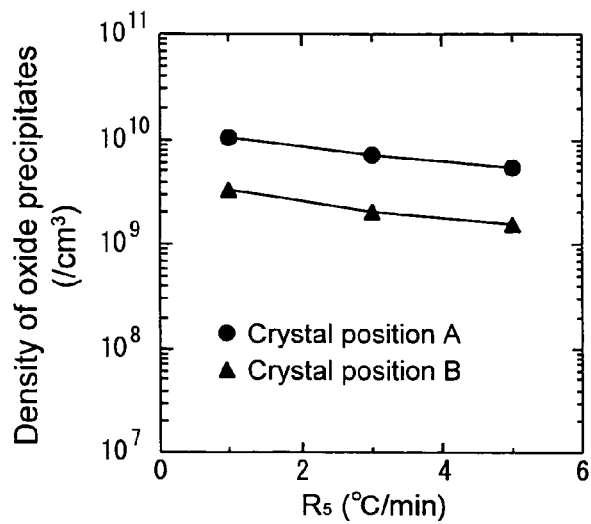
FIG. 29 is a graph showing a relationship between a temperature raising rate $R_5$ and density of oxide precipitates in Experimental Example 18.

FIG. 29 shows the density of oxide precipitates at 1° C./min, 3° C./min and 5° C./min of the $R_5$° C./min (Experimental Example 18). In this case, the other conditions were as follows: $T_9$=700° C., $t_5$=30 min, $T_{10}$=850° C., $t_6$=1 hr. Oxygen concentrations are 16 ppma to 18 ppma. The lower the $R_5$° C./min is, the higher the density of precipitates becomes. The reason why when the $R_5$° C./min is faster, the density of precipitates becomes lower is that there becomes higher the proportion of precipitation nuclei which are annihilated without growth in the temperature raising step. This result indicates that the high density of precipitates of the order of $10^9/cm^3$ or higher can be surely attained at the $R_5$° C./min of about 5° C./min or less.

Figure 30:
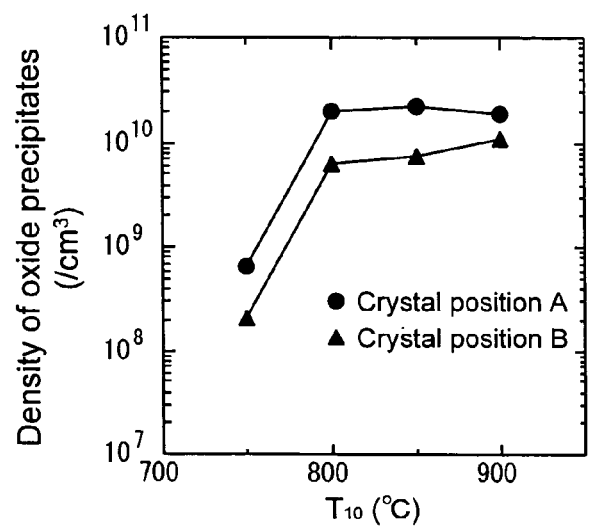
FIG. 30 is a graph showing a relationship between $T_{10}$ and density of oxide precipitates in Experimental Example 19.

FIG. 30 shows the density of oxide precipitates at 750° C., 800° C., 850° C. and 900° C. of the $T_{10}$ (Experimental Example 19). In this case, the other conditions were as follows: $T_9$=700° C., $t_5$=30 min, $R_5$=3° C./min and $t_6$=2 hrs. Oxygen concentrations are 18 ppma to 20 ppma. When the $T_{10}$° C. is 800° C. or higher, the density of precipitates becomes high independently of the temperature. The reason why in case of 750° C., the density of precipitates is low is that due to a slow growth rate of precipitates, the precipitates cannot grow to sizes at which they can survive in an epi step; they are annihilated in the epi step. This result shows that in order to obtain high density of precipitates, the $T_{10}$° C. is preferably about 800° C. or higher.

Figure 31:
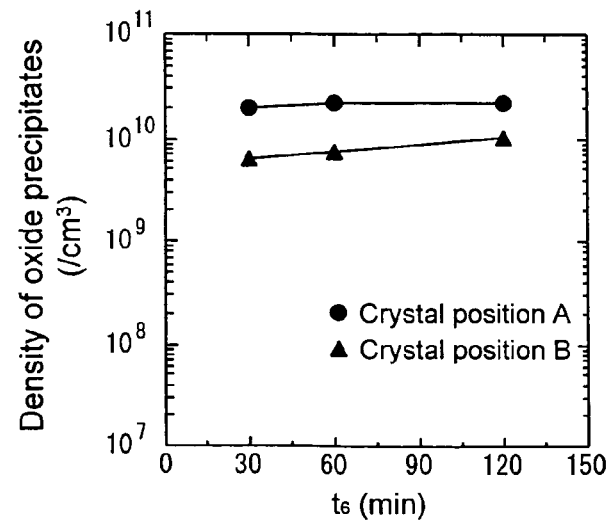
FIG. 31 is a graph showing a relationship between a keeping time $t_6$ and density of oxide precipitates in Experimental Example 20.

FIG. 31 shows the density of oxide precipitates at 30 min, 60 min and 120 min of the $t_6$ time (Experimental Example 20). In this case, the other conditions were as follows: $T_9$=700° C., $t_5$=30 min, $R_5$=3° C./min, $T_{10}$=850° C. Oxygen concentrations are 18 ppma to 20 ppma. The density of oxide precipitates becomes high almost independently of the $t_6$ time. This result indicates that the high density of oxide precipitates can be surely attained in the $t_6$ time of about 30 min or longer. Furthermore, in Experimental Example 20, when the $t_6$ time is 0 min, it turned out that the density of oxide precipitates detected with the LST was lower than $1 \times 10^9/cm^3$.

As described above, by setting the $T_9$° C. to about 700° C. or lower, the $R_5$° C./min to about 5/min or less, the $T_{10}$° C. to about 800° C. or higher and the $t_6$ time to about 30 min or longer, respectively, the higher the density of oxide precipitates in an epi wafer generated in a device fabrication process can be achieved. That is, there can be provided an epi wafer with an excellent IG capability. Note that the density of oxide precipitates each of the epi wafers manufactured in Experimental Examples 15 to 20 was measured with the LST prior to heat treatment at 1000° C. for 2 hrs, and it is confirmed that any wafer had the density of $1 \times 10^7/cm^3$ or lower Comparative Example 1

There were prepared wafers similar to the wafers prepared in the Experimental Examples 15 to 20, which were mirror-polished without heat treatment and then epi wafers were manufactured therefrom. The epi wafers were subjected to heat treatment at 1000° C. for 2 hrs, which simulates a device fabrication process and thereafter the density of precipitates thereof was measured with the LST.

As a result of the measurement, even at the oxygen concentration of about 19 ppma, the density of precipitates was about $1 \times 10^7/cm^3$ or lower. This indicates that if a silicon epitaxial wafer is not subjected to the heat treatment according to the method for manufacturing a silicon epitaxial wafer of the present invention, the silicon epitaxial wafer does not have an IG capability.

Experimental Examples 21 to 25

There were prepared silicon wafers each having a diameter of 8 inches, a plane orientation of <100> and resistivity of about 10 Ω·cm, which were sliced from different two portions (these portions belong to positions grown-in the former half and latter half of the crystal growth step and hereinafter may be referred to as a crystal position A and crystal position B, respectively) of a boron-doped silicon single crystal grown by means of a CZ method. The wafers prepared here were chemical etched wafers that are not subjected to mirror polishing. Oxygen concentrations of the wafers are 16 ppma to 20 ppma (JEIDA scale).

Then, the wafers were subjected to heat treatment according to the procedure shown in FIGS. 9 and 10. That is, the wafer was kept at $T_{11}$° C. for $t_7$ time, thereafter the temperature was raised from the $T_{11}$° C. to $T_{12}$° C. at a rate of $R_6$° C./min and kept at the $T_{12}$° C. for $t_8$ time. After the keeping, the temperature in a heat treatment furnace was lowered to 700° C. at a rate of 2° C./min and then the wafers were unloaded from the heat treatment furnace.

After the heat-treated wafers were mirror-polished, a silicon single crystal layer about 3 μm thick was deposited on each of the wafers by epitaxial growth at about 1100° C. to thereby obtain epi wafers.

Without the epi wafers being subjected to any heat treatment, the density of oxide precipitates in the wafer bulk below the epitaxial layer of each epi wafer was measured with the LST. With the LST, there are detectable oxide precipitates having sizes of about 40 nm or larger in diameter.

Figure 32:
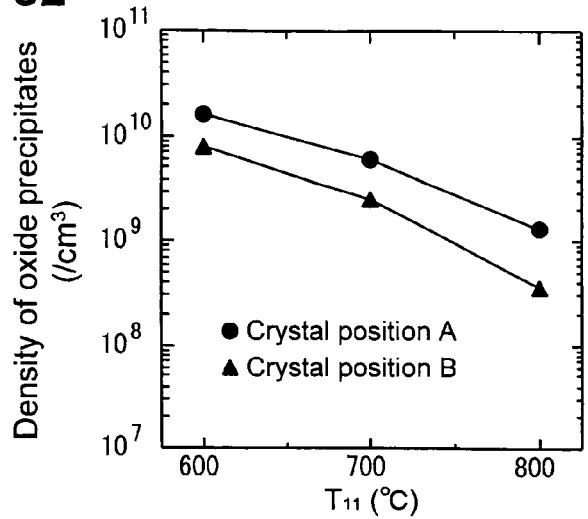
FIG. 32 is a graph showing a relationship between $T_{11}$ and density of oxide precipitates in Experimental Example 21.

FIG. 32 shows the density of precipitate at 600° C., 700° C. and 800° C. of the $T_{11}$° C. (Experimental Example 21). In this case, the other conditions were as follows: $t_7$=30 min, $R_6$=3° C./min, $T_{12}$=1000° C. and $t_8$=2 hrs. Oxygen concentrations are 16 ppma to 18 ppma. The lower the $T_{11}$° C. is, the higher the density of precipitates becomes. This is because there is increased the density of grown-in precipitation nuclei which grow at a lower temperature without annihilation. In order to obtain an excellent IG capability, the density of precipitates is desirably on the order of $10^9/cm^3$ or higher. This indicates that the $T_{11}$° C. is preferably about 700° C. or lower. Moreover, as shown in FIG. 32, by changing the $T_{11}$° C., the density of precipitates can be easily changed. This is effective where there is a desire for obtaining requested density of precipitates to a level of contamination in a device fabrication process.

Figure 33:
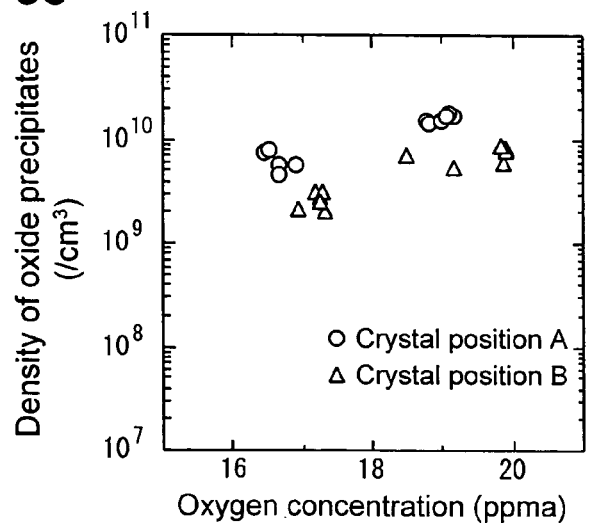
FIG. 33 is a graph showing a relationship between oxygen concentration and density of oxide precipitates in Experimental Example 22.

FIG. 33 shows the oxygen concentration dependence of density of precipitates at $T_{11}$=700° C., $t_7$=30 min, $R_6$=3° C./min, $T_{12}$=1000° C. and $t_8$=2 hrs (Experimental Example 22). This result indicates that in either crystal positions there is a trend that as the oxygen concentration increases, the density of oxide precipitates increases. It is also found that when the oxygen concentration is about 16 ppma or higher, the high density of precipitates of the order of $10^9/cm^3$ or higher can be surely achieved. This is because the higher the oxygen concentration is, the higher the density of grown-in precipitation nuclei becomes and the larger the sizes of oxide precipitates becomes, thereby a proportion of the detectable precipitates being increased.

Figure 34:
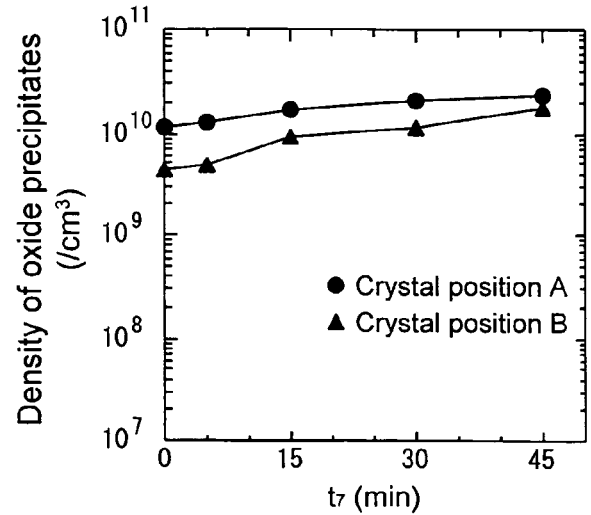
FIG. 34 is a graph showing a relationship between a keeping time $t_7$ and density of oxide precipitates in Experimental Example 23.

FIG. 34 shows the density of precipitates at 0 min, 5 min, 15 min, 30 min and 45 min of the $t_7$ time (Experimental Example 23). In this case, the other conditions were as follows: $T_{11}$=700° C., $R_6$=3° C./min, $T_{12}$=1050° C. and $t_8$=1 hr. Oxygen concentrations are 18 ppma to 20 ppma. When the $t_7$ time is about 15 min or longer, the density of precipitates increases with time. This is because as the $t_7$ time is longer, the proportion of grown-in precipitation nuclei to be grown without annihilation becomes higher and new precipitation nuclei are generated during the keeping of the $t_7$ time. This result indicates that even in the case where the $t_7$ time is shorter than 15 min, the high density of precipitates can be achieved, but in the case where the $t_7$ time is 15 min or longer, the density of precipitates is further increased; it is found that the later case is more preferable.

Figure 35:
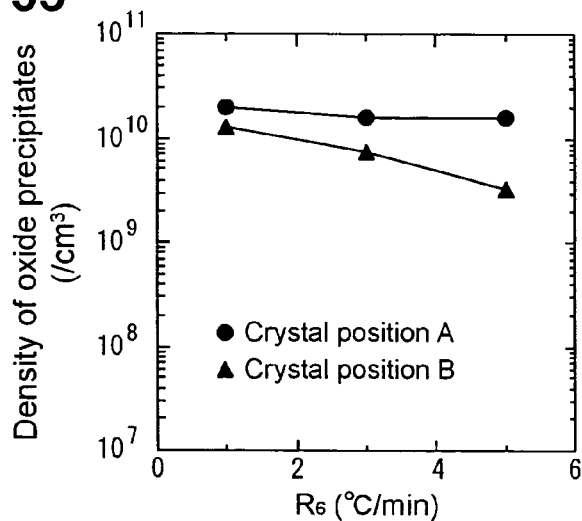
FIG. 35 is a graph showing a relationship between a temperature raising rate $R_6$ and density of oxide precipitates in Experimental Example 24.

FIG. 35 shows the density of oxide precipitates at 1° C./min, 3° C./min and 5° C./min of the $R_6$° C./min (Experimental Example 24). In this case, the other conditions were as follows: $T_{11}$=700° C., $t_7$=30 min, $T_{12}$=1050° C., $t_8$=1 hr. Oxygen concentrations are 18 ppma to 20 ppma. The lower the $R_6$° C./min is, the higher the density of precipitates becomes. The reason why when the $R_6$° C./min is faster, the density of precipitates becomes lower is that there becomes higher the proportion of precipitation nuclei which are annihilated without growth in the temperature raising step. This result indicates that in order to achieve the high density of precipitates of the order of $10^9/cm^3$ or higher, the $R_6$° C./min is preferably about 5° C./min or lower, more preferably about 3° C./min or lower.

Figure 36:
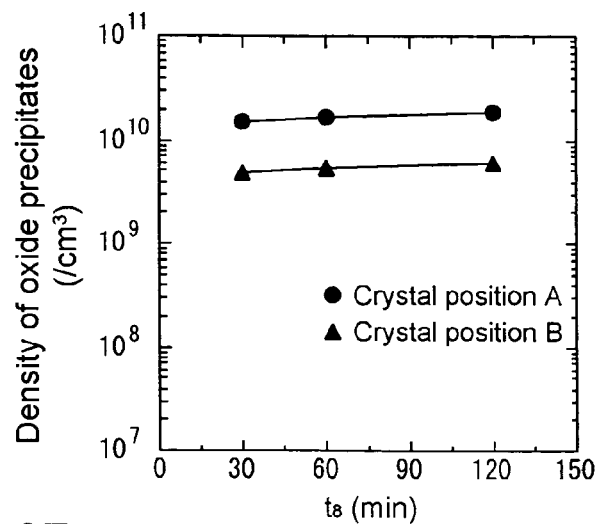
FIG. 36 is a graph showing a relationship between a keeping time $t_8$ and density of oxide precipitates in Experimental Example 25.

FIG. 36 shows the density of oxide precipitates at 30 min, 60 min and 120 min of the $t_8$ time (Experimental Example 25). In this case, the other conditions were as follows: $T_{11}$=700° C., $t_7$=30 min, $R_6$° C./min =3° C./min and $T_{12}$=1050° C. Oxygen concentrations are 18 ppma to 20 ppma. The density of oxide precipitates is high almost independently of the $t_8$ time. This result indicates that the high density of oxide precipitates can be surely attained in the $t_8$ time of about 30 min or longer.

Experimental Example 26

There were prepared wafers similar to the wafers used in Experimental Examples 21 to 25. The wafers were mirror-polished.

Then, according to a heat treatment procedure shown in FIGS. 9 and 10, the following conditions were applied: $T_{11}$=700° C., $t_7$=30 min, $R_6$=3° C./min and $t_8$=2 hrs, and there were performed 4 levels of heat treatment where the $T_{12}$° C. was changed to 950° C., 1000° C., 1050° C. and 1100° C., respectively. After the keeping at the $T_{12}$° C., the temperature in a heat treatment furnace was lowered to 700° C. at 2° C./min and then the wafers were unloaded from the heat treatment furnace.

A silicon single crystal layer about 3 μm thick was deposited on each of the heat-treated wafers by epitaxial growth at about 1100° C. to thereby obtain epi wafers. Without the epi wafers being subjected to any heat treatment, the density of oxide precipitates was measured with the LST.

Figure 37:
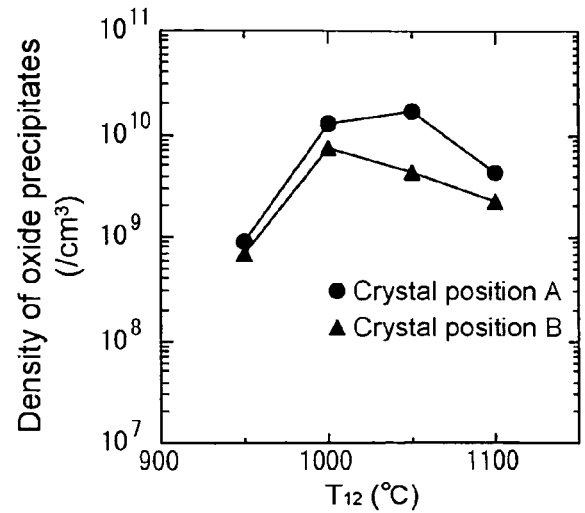
FIG. 37 is a graph showing a relationship between $T_{12}$ and density of oxide precipitates in Experimental Example 26.

FIG. 37 shows a relationship between the density of precipitates and the $T_{12}$° C. in this Experimental Example. Oxygen concentrations are 18 ppma to 20 ppma. When the $T_{12}$° C. is 1000° C. or higher, the density of precipitates becomes higher. The reason why the density of oxide precipitates lowers at 950° C. is that a growth rate of precipitates is slower than at 1000° C. or higher and hence sizes of precipitates are too small to be detectable with the LST. This result indicates that in order to generate precipitates of large sizes at high density at a stage prior to a device fabrication process, the $T_{12}$° C. is preferably about 1000° C. or higher.

As described above, by setting the $T_{11}$° C. to about 700° C. or lower, the $R_6$° C./min to about 5° C./min or less, the $T_{12}$° C. to about 1000° C. or higher and the $t_8$ time to about 30 min or longer, respectively, there can be achieved the higher density of oxide precipitates of sizes each having a gettering capability in an epi wafer prior to loading it into a device fabrication process. That is, an epi wafer having an excellent IG capability can be provided.

Comparative Example 2

There were prepared wafers similar to the wafers prepared in Experimental Examples 21 to 25, which were mirror-polished without heat treatment and then epi wafers were manufactured therefrom. The epi wafers were subjected to heat treatment at 1000° C. for 2 hrs, which simulates a device fabrication process and thereafter the density of precipitates thereof was measured with the LST.

As a result of the measurement, the density of precipitates in the epi wafer having the relatively higher oxygen concentration of about 19 ppma was about $1 \times 10^7/cm^3$ or lower even after the wafer was subjected to the heat treatment which simulates a device fabrication process. This indicates that if a silicon epitaxial wafer is not subjected to the heat treatment according to the heat-treating method of the present invention, the silicon epitaxial wafer does not have an IG capability.

Capability of Exploitation in Industry:

As described above, the first aspect of the method for manufacturing a silicon wafer of the present invention makes it possible to generate large oxide precipitates of high density in even a wafer containing almost no oxygen precipitation nuclei, so it is possible to impart an excellent IG capability even to a wafer to be used in a device fabrication process having a low temperature and a short time in a stable manner at a stage prior to the device fabrication process.

The second aspect of the method for manufacturing a silicon wafer of the present invention makes it possible by simple heat treatment to simultaneously realize growth of oxide precipitates in an interior of a wafer and more perfect annihilation of oxygen precipitation nuclei in the vicinity of a surface of the wafer due to out-diffusion of oxygen, thereby a DZ-IG structure being effectively formed, and in addition, by applying a wafer containing almost no COPs nor voids, to form a high quality DZ-IG structure containing almost not only no oxide precipitates but also no COPs nor voids.

The third aspect of the method for manufacturing a silicon wafer of the present invention makes it possible by simple heat treatment to simultaneously realize growth of oxide precipitates in an interior of a wafer and annihilation of oxygen precipitation nuclei in the vicinity of a surface of the wafer due to out-diffusion of oxygen, thereby a DZ-IG structure being effectively formed. Furthermore, by applying a wafer containing almost no COPs nor voids to this method, it is possible to form a DZ-IG structure containing almost not only no oxide precipitates but also no COPs nor voids.

The first aspect of the method for manufacturing a silicon epitaxial wafer of the present invention makes it possible to effectively use grown-in precipitation nuclei with annihilation thereof being suppressed to the lowest level possible, furthermore to efficiently grow sizes thereof for a short time, and to provide an epi wafer to which an excellent IG capability is imparted even in a device fabrication process having a low temperature and a short time.

The second aspect of the method for manufacturing a silicon epitaxial wafer of the present invention makes it possible by applying simple and short heat treatment prior to epitaxial growth to obtain a silicon epitaxial wafer in which there were generated oxide precipitates of sizes each having a gettering capability prior to loading the wafer into a device fabrication process, and therefore, to efficiently provide an epitaxial wafer capable of exerting a sufficient gettering capability even in a recent device fabrication process having a low temperature and a short time.

The first aspect of the silicon epitaxial wafer of the present invention has a sufficient gettering capability even in a device fabrication process having a low temperature and a short time.

The second aspect of the silicon epitaxial wafer of the present invention has a sufficient gettering capability even in a device fabrication process having a low temperature and a short time from the initial stage of the process.

The invention claimed is:

1. A method for manufacturing a silicon wafer wherein the silicon wafer having grown-in precipitation nuclei generated in a growth step of a silicon single crystal is subjected to heat treatment to impart a gettering capability thereto, comprising at least the following three steps of: a temperature raising step $A_1$ for growing the grown-in precipitation nuclei; a temperature raising step $B_1$ for further raising a temperature of the silicon wafer to a keeping temperature higher than that in the temperature raising step $A_1$; and a constant temperature keeping step $C_1$ for growing the grown-in precipitation nuclei into oxide precipitates each of a size equal to or larger than one having a gettering capability and for out-diffusing oxygen in the vicinity of a surface of the silicon wafer,
wherein the temperature raising step $A_1$ is a step for raising a temperature of the silicon wafer from $T_6°$ C. to $T_7°$ C. at a rate of $R_3°$ C./min, wherein the $T_6°$ C. is 700° C. or lower, the $T_7°$ C. is 800° C. to 1000° C. and the $R_3°$ C./min is 3° C./min or less.

2. The method for manufacturing a silicon wafer according to claim 1, wherein the temperature raising step $A_1$, the temperature raising step $B_1$ and the constant temperature keeping step $C_1$ are performed continuously.

3. The method for manufacturing a silicon wafer according to claim 1, wherein prior to raising the temperature from the $T_6°$ C. to the $T_7°$ C. in the temperature raising step $A_1$, the silicon wafer is kept at the $T_6°$ C. for 30 min or longer.

4. The method for manufacturing a silicon wafer according to claim 1, wherein the temperature raising step $B_1$ is a step for raising a temperature of the silicon wafer from $T_7°$ C. to $T_8°$ C. at a rate of $R_4°$ C./min, wherein the $T_7°$ C. is 800° C. to 1000° C., the $T_8°$ C. is 1050° C. to 1230° C. and the $R_4°$ C./min is 5° C./min or more.

5. The method for manufacturing a silicon wafer according to claim 1, wherein the constant temperature keeping step $C_1$ is a step for keeping the silicon wafer at $T_8°$ C. for $t_4$ time, wherein the $T_8°$ C. is 1050° C. to 1230° C. and the $t_4$ time is 30 min or longer.

6. The method for manufacturing a silicon wafer according to claim 1, wherein oxygen concentration of the silicon wafer to be subjected to the heat treatment is 14 ppma to 17 ppma.

7. The method for manufacturing a silicon wafer according to claim 1, wherein the silicon wafer having grown-in precipitation nuclei is a wafer having a few defects that is manufactured from a silicon single crystal pulled under the conditions suppressing generation of void defects in growth thereof.

8. The method for manufacturing a silicon wafer according to claim 1, wherein a size of the oxide precipitate is 40 nm or larger in diameter.

9. The method for manufacturing a silicon wafer according to claim 1, wherein a diameter of the silicon wafer is 300 mm or larger.

* * * * *

UNITED STATES PATENT AND TRADEMARK OFFICE
CERTIFICATE OF CORRECTION

PATENT NO. : 7,033,962 B2  
APPLICATION NO. : 10/482843  
DATED : April 25, 2006  
INVENTOR(S) : Hiroshi Takeno It is certified that error appears in the above-identified patent and that said Letters Patent is hereby corrected as shown below:

On Title Page  
PCT Filed (Item 22):

Replace "May 30, 2002" with --May 23, 2002--.

Signed and Sealed this

Eleventh Day of September, 2007

JON W. DUDAS  
*Director of the United States Patent and Trademark Office*